(12) United States Patent
Yevtukhov et al.

(10) Patent No.: US 8,835,869 B2
(45) Date of Patent: *Sep. 16, 2014

(54) ION SOURCES AND METHODS FOR GENERATING AN ION BEAM WITH CONTROLLABLE ION CURRENT DENSITY DISTRIBUTION

(75) Inventors: Rustam Yevtukhov, Briarwood, NY (US); Boris L. Druz, Brooklyn, NY (US); Viktor Kanarov, Bellmore, NY (US); Alan V. Hayes, Great Neck, NY (US)

(73) Assignee: Veeco Instruments, Inc., Plainview, NY (US)

( * ) Notice: Subject to any disclaimer, the term of this patent is extended or adjusted under 35 U.S.C. 154(b) by 138 days.

This patent is subject to a terminal disclaimer.

(21) Appl. No.: 13/448,282

(22) Filed: Apr. 16, 2012

(65) Prior Publication Data
US 2012/0211166 A1    Aug. 23, 2012

Related U.S. Application Data

(63) Continuation-in-part of application No. 12/037,598, filed on Feb. 26, 2008, now Pat. No. 8,158,016, and a continuation-in-part of application No. 11/678,979, filed on Feb. 26, 2007, now Pat. No. 7,557,362, which is a continuation-in-part of application No. 10/772,132, filed on Feb. 4, 2004, now Pat. No. 7,183,716.

(60) Provisional application No. 60/891,669, filed on Feb. 26, 2007, provisional application No. 60/444,731, filed on Feb. 4, 2003.

(51) Int. Cl.
*H01J 49/10* (2006.01)
*H01J 1/50* (2006.01)
*H01J 37/08* (2006.01)
*H01J 37/305* (2006.01)
*H01L 21/311* (2006.01)
*H01J 27/18* (2006.01)

(52) U.S. Cl.
CPC ............ *H01J 27/18* (2013.01); *H01J 37/3053* (2013.01); *H01J 2237/24542* (2013.01); *H01L 21/31105* (2013.01); *H01J 2237/083* (2013.01); *H01J 37/08* (2013.01); *H01J 2237/061* (2013.01)
USPC ................ 250/423 R; 250/424; 250/396 ML; 250/396 R; 315/111.21; 315/111.81; 315/111.01

(58) Field of Classification Search
USPC .......... 250/423 R, 424, 396 ML; 315/111.21, 315/111.81, 111.01; 118/723 I
See application file for complete search history.

(56) References Cited

U.S. PATENT DOCUMENTS

| | | | |
|---|---|---|---|
| 7,183,716 B2 * | 2/2007 | Kanarov et al. | 315/111.51 |
| 7,557,362 B2 * | 7/2009 | Yevtukhov et al. | 250/423 R |
| 8,158,016 B2 * | 4/2012 | Hayes et al. | 216/59 |

* cited by examiner

*Primary Examiner* — Nikita Wells
(74) *Attorney, Agent, or Firm* — Wood, Herron & Evans, LLP

(57) ABSTRACT

Ion sources and methods for generating an ion bean with a controllable ion current density distribution. The ion source includes a discharge chamber having an optical grid position proximate at a first end and a re-entrant vessel positioned proximate a second end that opposes the first end. A plasma shaper extends from the re-entrant vessel and into the plasma discharge chamber. A position of the plasma shaper is adjustable relative to the grid-based ion optic such that the plasma shaper may operably change a plasma density distribution within the discharge chamber.

15 Claims, 16 Drawing Sheets

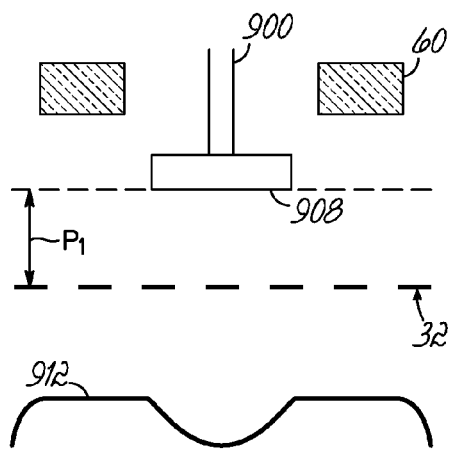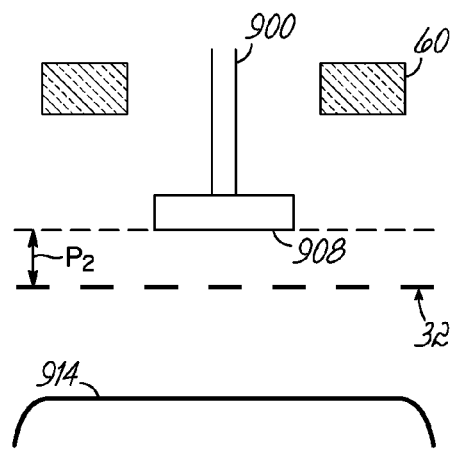
FIG. 22A  FIG. 22B
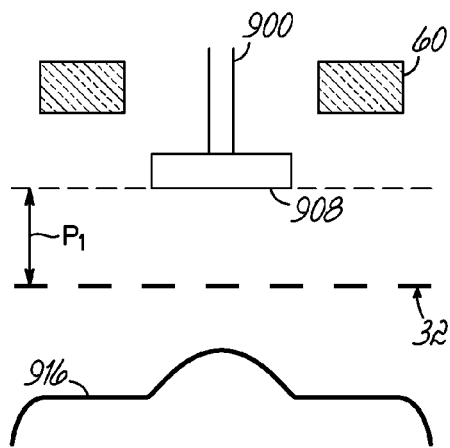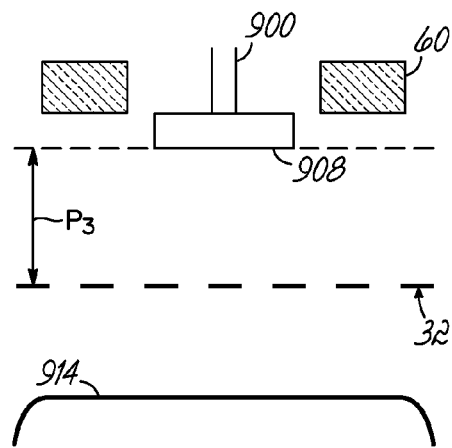
FIG. 23A  FIG. 23B

ION SOURCES AND METHODS FOR GENERATING AN ION BEAM WITH CONTROLLABLE ION CURRENT DENSITY DISTRIBUTION

CROSS-REFERENCE TO RELATED APPLICATIONS

The present application is a continuation-in-part of U.S. application Ser. No. 12/037,598, filed Feb. 26, 2008 (now U.S. Pat. No. 8,158,016), which claims the benefit of U.S. Provisional Application No. 60/891,669, filed Feb. 26, 2007, and which is also a continuation-in-part of U.S. application Ser. No. 11/678,979, filed Feb. 26, 2007 (now U.S. Pat. No. 7,557,362), which is a continuation-in-part of U.S. application Ser. No. 10/772,132, filed Feb. 4, 2004 (now U.S. Pat No. 7,183,716), which claims the benefit of U.S. Provisional Application No. 60/444,731, filed Feb. 4, 2003. The disclosure of each of these applications is hereby incorporated herein by reference in its entirety.

FIELD OF THE INVENTION

The present invention relates to devices and methods of operating an electromagnet of an ion source to generate an ion beam with tailored operating characteristics.

BACKGROUND OF THE INVENTION

Ion beam processing systems are used in a variety of applications for modifying the properties of a substrate during the fabrication of thin film devices, such as semiconductor and data storage devices. In particular, one or more etching processes may be used to remove and shape layers of material on the substrate. One conventional etching procedure involves the use of a working gas that is ionized into a plasma state at low pressures (i.e., at pressures less than about 1 mTorr). Ions are extracted from the plasma and accelerated toward the substrate by ion optics for ion beam etching ("IBE") of the layers of material.

As device critical dimensions shrink, the need for improved process uniformity without sacrificing beam directionality has driven the search for improved ion sources. IBE uniformity is directly related to the beam current density and the distributions of ions and energetic neutrals, wherein charged ions are converted to neutrals during beam transport via charge exchange ion-atom collisions. The integrated beam particle flux should be independent of the impact position on the substrate. The angular distributions of the charged and neutral beam particles at the substrate are directly related to the angular properties of the trajectories of the ions extracted from the plasma by the optics of the source. To optimize process uniformity, the incident particle trajectories should be approximately parallel across the surface of the substrate.

Conventional ion sources utilize a helical or coil antenna wrapped about a discharge vessel to generate an inductively coupled plasma ("ICP") using high frequency electromagnetic field energy, including, for example, radio-frequency ("RF") electromagnetic energy. The antenna of the ion source, when carrying an oscillating high frequency current, induces a time-varying magnetic field inside the discharge vessel. In accordance with Faraday's law, the time-varying magnetic field induces a solenoidal, high frequency electric field that accelerates electrons in an azimuthal direction within the discharge vessel and sustains the ICP. In such manner, the RF-ICP source may generate relatively high plasma densities, such as on the order of $10^{11}$ cm$^{-3}$. To provide the initial "seed" electrons required to ignite the RF-ICP source, the plasma may be ignited by imbibing electrons generated by an electron source in the process chamber during the start-up period. Alternatively, an igniter may be provided within the plasma generator. This igniter may be a pair of electrodes attached to a spark generator.

Because low pressure ICPs are diffusion dominated, the plasma density and, thus the radial plasma ion flux distribution at the ion optics plane, is invariably convex, i.e., largest at the center of the ion source and decreasing radially outwardly from the center of the ion source. This results in non-uniform ion current density distribution of broad ion beams generated by such conventional ion sources.

Typical broad beam ion sources utilize a multi-electrode accelerator system for forming and accelerating the ions into a beam. The electrodes in this system are flat or dished multi-aperture plates, typically called grids. A conventional method of compensating for the effect on the ion density profile of the plasma non-uniformities described above is to radially vary the transparency of the grids so as to decrease the beam current density in the center. However, this compensation method has several limitations. Variations in the transparency of the ion optics cannot compensate for variations in the plasma density profile for different ion source operating conditions (i.e., RF power, beam voltage and current, gas type and pressure), for any time dependence of these factors between system maintenance periods, or for variations in source and ion optics. The variations in source and ion optics may be either short and/or long term service condition changes in a given etch module because of the effect of mass and thermal loads, or module-to-module variations due to differences in ion source or grid construction. In some instances, a concave or convex beam ion density distribution may be desirable so as to compensate for variations in other aspects of processing of the substrates, including, for example, beam spreading during transport to the substrate, clamp effects at the periphery of the substrate, variations in the thickness of the material layer being etched, or variations in the width of the etch mask features.

Localized variations in the radial and/or azimuthal density distributions of the plasma typically limit the uniformity of the IBE process. The location and shape of these variations are dependent on the operating conditions. The transparency of the grid optics cannot be easily modified to compensate for this dependence on operating conditions.

Ion sources may be constructed so as to reduce non-uniformities in the ion beam profile. However, the ion source may still require an adjustment to eliminate non-uniformities in the ion beam density. The adjustment may be required when an ion source is initially used, after an ion source is used for an extended period of time, if process conditions are changed, or following source maintenance. The ability to make efficient adjustments after these events may increase yields of usable devices created from the ion source operation and may reduce waste.

Known conventional devices may further include features for tuning the ion flux uniformity within a grid-based RF-inductively coupled ion source. Such features may use a re-entrant vessel, positioned at a distance, H, from a screen grid of the grid-assembly. By decreasing H, the ion flux within the center of the ion source may be suppressed. Additionally, extensions may be included to fine tune radial variations in the ion flux distribution so as to flatten out any asymmetric peaks in the plasma distribution.

In still other known, conventional devices, an electromagnet is included with a pole piece adjacent thereto and within the plasma discharge chamber. The magnetic field generated by the electromagnet with the pole piece is configured to provide another mechanism of tuning the plasma ion flux distribution. It is possible that tailoring the grid design may cause the flux profile to be at least partially concave or convex, or otherwise flat. Accordingly, this may compensate for grid or other process variations that would otherwise result in significant non-uniform ion beam etch profiles.

While the grid-based design is configured to achieve a uniform distribution at a chosen magnetic field strength, B, for a particular condition of the ion source and system, other radial flux distributions may be compensated by increasing or decreasing the magnetic field strength. However, there are practical limits to the tunable range of the magnetic field. Thus, there exists a need for ion sources that provide for a larger range of adjustability of the ion flux distribution, such as being configurable to compensate for greater grid variation to extend grid lifetime, that would reduce grid fabrication tolerances, and that allow for lower cost grid designs. More particularly, there exists a need for devices and method that are amendable to making localized adjustments to the ion beam current density and allowing a larger range of magnetic field tuning.

SUMMARY OF THE INVENTION

The present invention overcomes the foregoing problems and other shortcomings and drawbacks of ion energy analyzers of the prior art. While the present invention will be described in connection with certain embodiments, it will be understood that the present invention is not limited to these embodiments. To the contrary, this invention includes all alternatives, modifications, and equivalents as may be included within the scope of the present invention.

According to one embodiment of the present invention, Ion sources and methods for generating an ion beam with a controllable ion current density distribution. The ion source includes a discharge chamber having an optical grid position proximate at a first end and a re-entrant vessel positioned proximate a second end that opposes the first end. A plasma shaper extends from the re-entrant vessel and into the plasma discharge chamber. A position of the plasma shaper is adjustable relative to the grid-based ion optic such that the plasma shaper may operably change a plasma density distribution within the discharge chamber.

In accordance with another embodiment of the present invention, a plasma processing apparatus includes an evacuated chamber with opposing ends. The ion source is positioned within the evacuated chamber, proximate to one of the opposing ends. A substrate holder is positioned proximate to the other of the opposing ends. The substrate holder is configured to support a substrate thereon.

Another embodiment of the present invention is directed to a method of operation method of operating a radiofrequency ion source that includes a discharge chamber with a discharge space therein. The method includes generating a plasma with a plasma density distribution from a working gas in the discharge space of the discharge chamber. An ion beam is extracted from the plasma with at least one electrode disposed at a first end of the discharge space. By moving a plasma shaper with respect to the at least one electrode, the plasma density distribution is adjusted.

BRIEF DESCRIPTION OF THE DRAWINGS

The accompanying drawings, which are incorporated in and constitute a part of this specification, illustrate embodiments of the present invention and, together with a general description of the invention given above and the detailed description of the embodiments given below, serve to explain the principles of the present invention.

FIGS. 22A-23B are diagrammatic views illustrating one method of using the electromagnet with plasma shaper of FIG. 17.

DETAILED DESCRIPTION

The present invention provides a charged particle source in which very low divergence beamlets are formed from particular ion optics structures of a grid-based plasma-driven ion source. The source forms a broad collimated uniform beam from an array of charged particle beamlets, in which the beamlet current densities are uniform. Each beamlet has a very small angular, but uniform, divergence, and the mean direction vectors of the beamlets are substantially parallel across the usable surface area of the ion source. The charged particle current density profile may also be optimized for processes in which the substrate is moved in front of the beam during the process, so that the substrate motion attains a very uniform particle treatment.

Figure 1:
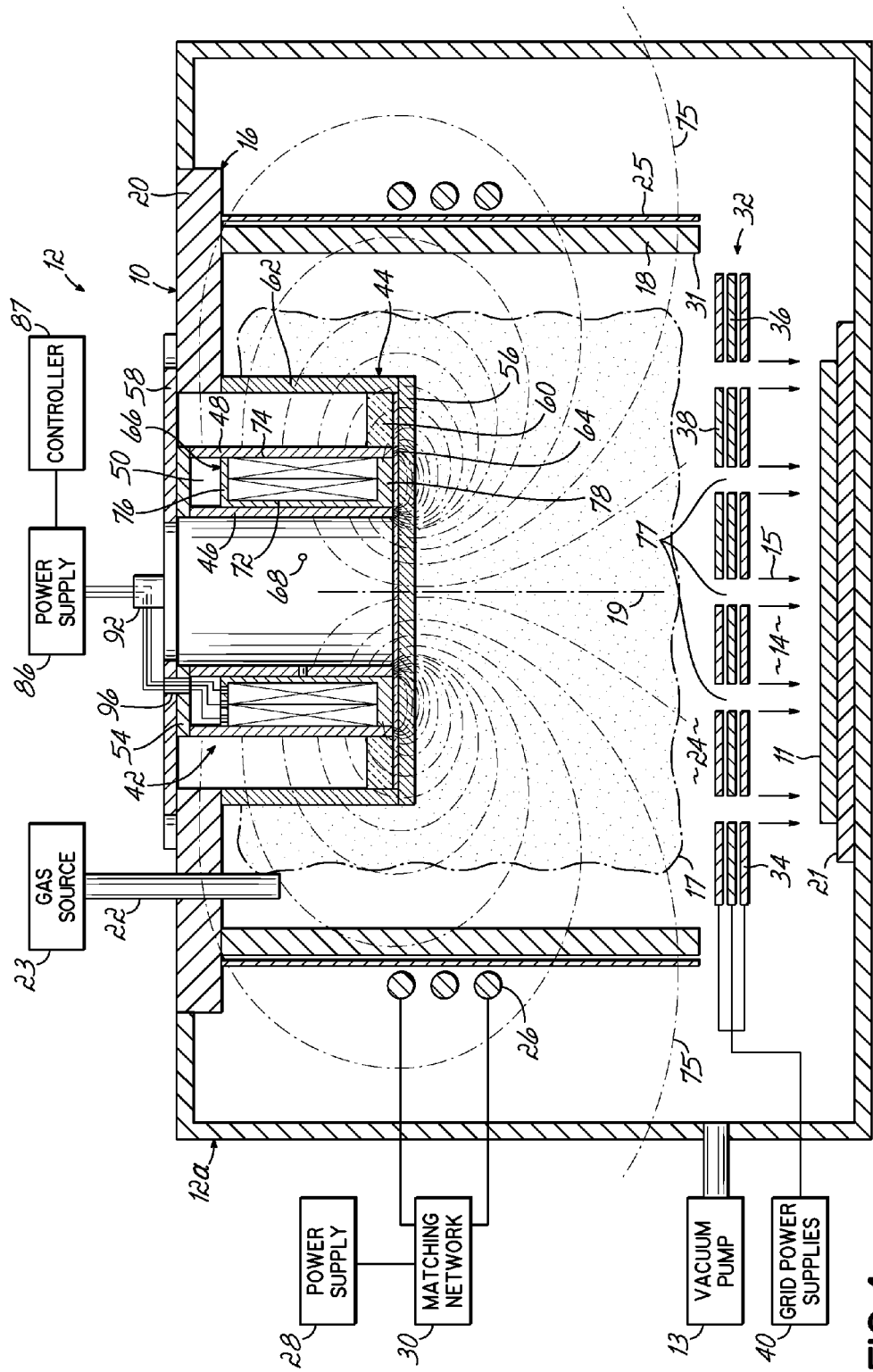
FIG. 1 is a cross-sectional view of a portion of a high vacuum processing system incorporating an ion source with an embodiment of an electromagnet assembly.
Figure 2:
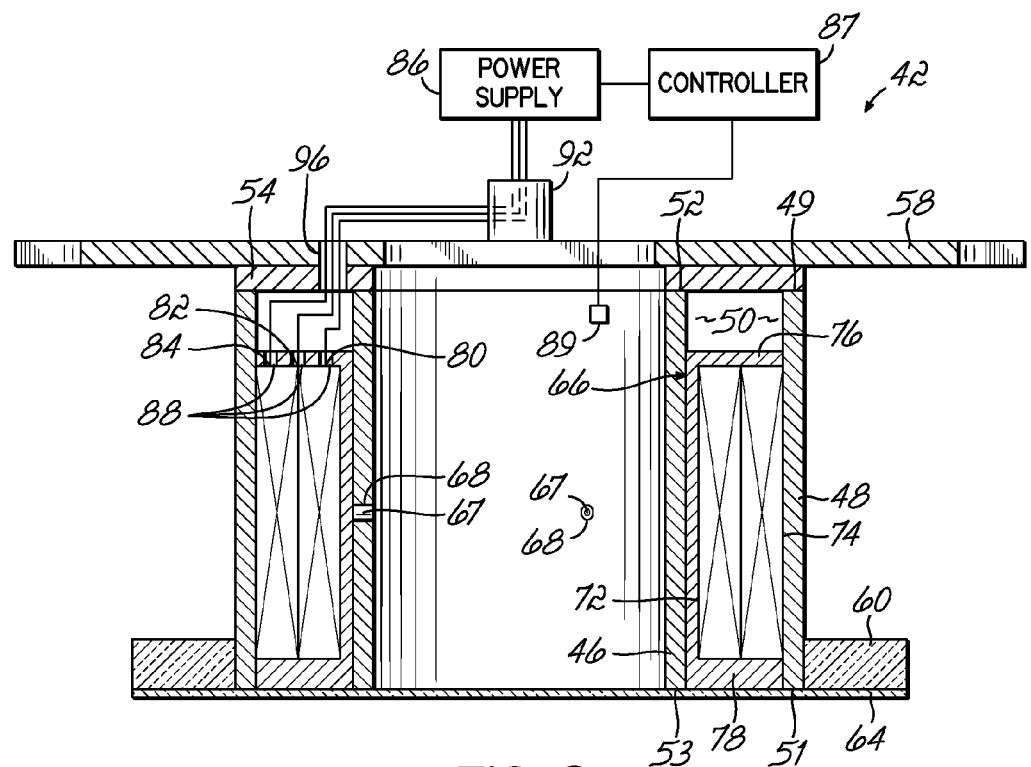
FIG. 2 is an enlarged view of an electromagnet assembly of the ion source and electromagnet assembly of FIG. 1.

With reference to FIGS. 1 and 2, an ion source 10 for use in a vacuum processing system 12 is configured to generate an ion beam of working gas ions, illustrated herein as arrows 15, that is directed toward at least one substrate 11. The vacuum processing system 12 includes a process chamber 12a with a chamber wall that encloses a processing space 14 and a high vacuum pump 13 configured to communicate with the processing space 14 through the chamber wall of the process chamber 12a. The ion beam 15 may comprise working gas ions, extracted from a plasma 17 generated from an ionizable working gas by the ion source 10, and that are directed through the process chamber 12a toward the substrate 11. Bombardment of the substrate 11 by the ion beam 15 processes the substrate 11 to achieve an intended beneficial result, which may include, for example, removal of material from a top surface of the substrate 11 by an ion beam etching process.

The ion source 10 further includes a discharge chamber 16 that defined by tubular sidewall 18 and is generally centered about an azimuthal axis 19 of the process chamber 12a. The tubular sidewall 18 has an opening defined by an open end 31 and a back flange 20 that closes an opposing end of the tubular sidewall 18. The tubular sidewall 18 may be formed, at least partially, from a dielectric material, such as quartz or alumina. High frequency electromagnetic energy, in particular radio frequency ("RF") electromagnetic energy, may penetrate the dielectric material portion of the tubular sidewall 18 with low losses within the material.

The ion source 10 still further includes various high vacuum sealing members (not shown) that provide hermetic seals for vacuum isolation. A gas inlet 22, which extends through the back flange 20, communicates with a discharge space 24 enclosed inside the discharge chamber 16 and permits a regulated flow of the working gas from a metered gas source 23 and into the discharge space 24. A sub-atmospheric environment, which may be at a vacuum pressure ranging from about 0.05 mTorr to about 5 mTorr, is maintained in the discharge space 24 by virtue of fluid communication with the evacuated process chamber 12a.

A coil antenna 26 is wrapped about a portion of the exterior of the discharge chamber 16, with a power supply 28 electrically coupled thereto via an impedance matching network 30. The power supply 28 may provide power to the coil antenna 26 at a frequency ranging from about 500 kHz to about 15 MHz. An optional Faraday shield 25 may be disposed between the coil antenna 26 and the tubular sidewall 18.

High frequency electromagnetic energy, such as RF electromagnetic energy, is transmitted from the coil antenna 26 to the working gas in the discharge space 24 for igniting and sustaining the plasma 17. More specifically, an electrical current oscillates at a high frequency in the coil antenna 26, which generates a time-dependent magnetic field that is transmitted to the discharge space 24 through the optional Faraday shield 25 and subsequently through the tubular sidewall 18. The time-dependent magnetic field induces an azimuthal electric field inside the discharge space 24 having field lines concentric with the coil antenna 26. The induced azimuthal electrical field accelerates electrons inside the discharge space 24 to travel along circular trajectories. Collisions between the energetic electrons and neutral atoms of the working gas ionize the working gas atoms and generate additional electrons that are also accelerated within the azimuthal electrical field.

A multi-aperture ion optic or grid assembly 32 may be positioned at an open end 31 of the tubular sidewall 18 and is operable to extract the working gas ions from the plasma 17 in the discharge space 24 and to the ion beam 15 that propagates to the substrate 11. The grid assembly 32 may comprise a plurality of grids 34, 36, 38 spanning the tubular sidewall 18 at the open end 31 of the ion source 10. When appropriately biased, the grids 34, 36, 38 substantially contain the plasma 17 within the discharge space 24 and control the extraction of the ion beam 15 from the discharge space 24. Each grid 34, 36, 38 may be perforated by an array of apertures 77 so that charged particles (electrons and/or ions) may pass through the grid assembly 32. Typically, the apertures 77 of the grids 34, 36, 38 are round and closely aligned with each other.

The substrate 11 may be supported within the processing space 14 and space away from the grid assembly 32 and held on a substrate support 21 that is disposed within the process chamber 12a such that a top surface of the substrate 11 confronts the open end 31. The substrate 11 may, in some embodiments, be tilted, offset, and/or otherwise rotated about or relative to its own azimuthal axis.

One or more grid power supplies 40 may be electrically coupled to the grids 34, 36, 38. In one a positive ion beam embodiment, an extraction or "screen" grid 38 may be biased by at least one grid power supply 40 with an adjustable positive electrical potential to allow formation of a positive ion beam from the discharge to the beam and to increase the ion energy. An "accelerator" or "suppressor" grid 36 may be biased by at least one grid power supply 40 with an adjustable negative electrical potential to increase the effective ion beam extraction voltage and suppress penetration of beam plasma electrons through the grid apertures of "decelerator" grid 34, which is typically at a ground potential.

A cup-shaped re-entrant vessel 44 projects from the back flange 20 and into the discharge space 24 toward grid assembly 32. The re-entrant vessel 44, which may be formed from a conductor, such as aluminum, includes an end wall 56 and a sidewall 62 extending axially from the end wall 56 and toward the back flange 20. The sidewall 62 of the re-entrant vessel 44 and the tubular sidewall 18 of the discharge chamber 16 may be concentrically and coaxially aligned with the azimuthal axis 19.

With reference to FIGS. 1 and 2, the ion source 10 includes an electromagnet 42 that is at least partially installed in the re-entrant vessel 44 and that includes one or more pole pieces. The pole pieces are illustrated herein as tubular pole pieces 46, 48 having a geometrical shape that is substantially cylindrical and concentrically arranged about the azimuthal axis 19. In alternative embodiments, the pole pieces 46, 48 may have any suitable tubular geometric shape, including, but not limited to, elliptical cylinders, conical frustums, or pyramidal frustums, each of which includes a sidewall extending about a central bore.

In the representative embodiment, the first pole piece 46 is disposed radially inside second pole piece 48 such that the outer concave surface of the first pole piece 46 confronts the inner convex surface of the second pole piece 48. The first pole piece 46 includes opposite open ends 52, 53 that are separated by a height along the azimuthal axis 19. The second pole piece 48 extends between opposite open ends 49, 51, also separated by the height. The pole pieces 46, 48 are separated by an open space or gap 50.

The axial position of the electromagnet 42 with respect to the grid assembly 32 and/or the lateral position with respect to the azimuthal axis 19 may be optimized to tailor the profile of the plasma density distribution and, thereby, a distribution of the plasma ion flux at the grids 34, 36, 38. Optimization may include controlling the distribution of the electromagnetic field of the electromagnet 42 within the discharge space 24. In particular, the electromagnet 42 may be laterally and asymmetrically positioned relative to the azimuthal axis 19 so as to compensate for any systematic asymmetry in the plasma density distribution intrinsic to the vacuum processing system 12. Tailoring the plasma ion flux distribution permits the current density distribution of the ion beam 15 extracted from the plasma 17 to be optimized.

The open ends 52, 49 of the pole pieces 46, 48 are mounted with conventional fasteners (not shown) to a ring-shaped magnetic core element 54 of the electromagnet 42. The pole pieces 46, 48 and the core element 54 are formed from a magnetically permeable material, such as low carbon steel, iron, or any other suitable ferromagnetic material, and are electrically grounded. In an alternative embodiment, the core element 54 may be fabricated from a nonmagnetic material.

The electromagnet 42 is secured with conventional fasteners between the core element 54 and a nonconductive mounting plate 58, which peripherally overlaps the back flange 20. The mounting plate 58 may be secured by conventional fasteners (not shown) to the back flange 20. The electrically-insulating strength of mounting plate 58 allows the core element 54 and pole pieces 46, 48 to be electrically grounded without shorting to the back flange 20, which may be permitted to electrically float with the potential of the plasma. The optimum position and dimension of the electromagnet 42 and the re-entrant vessel 44 may depend on characteristics of the plasma and the application, such as the required zone of uniformity, RF power, and beam parameters.

The electromagnet 42 may be positioned within the re-entrant vessel 44 (for example, centered) a ring 60 that is fabricated from an electrically insulating material, similar to the mounting plate 58. Suitable electrically insulating materials include, but are not limited to, a glass epoxy laminate or a phenolic resin. The ring 60 is disposed between the second pole piece 48 and sidewall 62 and has an outer diameter that approximately equal to an inner diameter of the sidewall 62 of the re-entrant vessel 44 so as to establish a snug fit. The inner diameter of the ring 60 may be slightly larger than the outer diameter of the second pole piece 48. The ring 60 is secured to the second pole piece 48 with conventional fasteners.

A plate 64 of an insulating material is interposed between the end wall 56 of the re-entrant vessel 44 and the pole pieces 46, 48 of the electromagnet 42. The insulating material constituting the plate 64 may include, for example, a polymeric fluorocarbon material such as polytetrafluoroethylene ("PTFE"), the homopolymer of tetrafluoroethylene being commercially-available from E.I. du Pont de Nemours and Company (Wilmington, Del.) under the trade name TEFLON.

The electromagnet 42 includes a wire bobbin or spool 66, wire coils 72, 74, and the pole pieces 46, 48. Each wire coil 72, 74 comprises a continuous winding of an insulated conductor wrapped about the wire spool 66 with a suitable solenoidal winding pattern. In specific exemplary embodiments, the number of turns in the wire coils 72, 74 may range from about 300 turns to about 3000 turns.

The wire spool 66, which may be formed from a polymer resin or other nonmagnetic material, is situated within the gap 50 and between the pole pieces 46, 48. The height of the wire spool 66 is shorter than the height of the pole pieces 46, 48. The first pole piece 46 includes holes 68 dimensioned to receive setscrews 67 that are tightened to secure the axial position of the wire spool 66 along the azimuthal axis 19. When the setscrews 67 are loosened, the axial location of the wire spool 66 may be shifted toward the end wall 56 of the re-entrant vessel 44 and in a direction toward the core element 54. The wire spool 66 is depicted in FIGS. 1 and 2, for purposes of illustration only, as shifted to an axial position remote from the core element 54 and in close proximity to the end wall 56. Located at opposite ends of the wire spool 66 are radially-extending flanges 76, 78.

In an alternative embodiment, the core element 54 may be omitted from the construction of the electromagnet 42 by selection of a mounting mechanism (not shown) on a mounting plate 58 of appropriate mechanical strength. In still other embodiments, the axial position of the wire spool 66 may be adjusted in a different manner, such as by pins received in appropriately sized openings, each opening determinative of different locations relative to the end wall 56. In yet another alternative embodiment, the axial location of the wire spool 66 may be fixed relative to the end wall 56 at an axial location so that the axial position of the wire spool 66 is a controlled variable.

In alternative embodiments, the shape of the back flange 20 may be any practical geometry, including, for example, a plate or a dome (either re-entrant or non-re-entrant). In such alternative embodiments, the electromagnet 42 may be disposed outside the back flange 20 and opposite to the grid assembly 32 but within a working distance such that the amplitude of the electromagnetic field generated inside the discharge space 24 is significant (i.e., at least on the order of the strength of the Earth's magnetic field). In general, the exact shape of the pole pieces 46, 48 of the electromagnet 42 may be shaped in a manner to conform to the shape of the back flange 20 and/or optimize the magnetic field distribution inside the re-entrant vessel 44.

With continued reference to FIGS. 1 and 2, the wire coils 72, 74 of electromagnet 42 are positioned between the flanges 76, 78 and are centered in a radial direction about (i.e., coaxial with) the azimuthal axis 19. The continuous insulated conductor of the first magnetic wire coil 72 extends between a first end terminal or tap 80 and a second end terminal or tap 82. The continuous insulated conductor of the second magnetic wire coil 72 extends between a third end terminal or tap 84 on wire coil 74 and the second end tap 82, which is shared with the magnetic wire coil 72.

The wire coils 72, 74 of electromagnet 42 are electrically coupled with a power supply 86, which is, in turn, electrically coupled with a controller 87. Positive and negative voltage polarity terminals of the power supply 86 may be electrically coupled with a first set of taps 80, 82 to provide a first range of operation that includes only the continuous conductor of wire coil 72, a second set of taps 80, 84 to provide a second range of operation in which the continuous conductor of wire coils 72, 74 are connected in series, or a combination of taps 82, 84 to provide a third range of operation that includes only the continuous conductor of wire coil 74. A switching device (not shown) may be provided in the power supply 86 to adjust the closed circuit with the wire coils 72, 74 and selectively establish each of the three ranges. Holes 88 within the flange 76 of the wire spool 66 provide access for conductors and establish a closed circuit between the taps 80, 82, 84 and the power supply 86. The conductors may be routed through a wireway 96 defined in the core element 54 and mounting plate 58. A guidepost 92 serves as a feed-through for routing the conductors to the power supply 86.

In an alternative embodiment, the electromagnet 42 may omit one of the two coils 72, 74 such that only a single range of operation exists. The taps of the remaining wire coil 72, 74 are coupled, in a closed circuit, with the power supply 86 and energized by current from the power supply 86. The power supply 86 may be a direct current ("DC") power supply or, alternatively, may comprise a pulsed DC power supply or an alternating current ("AC") power supply. The power supply settings are controlled by the controller 87, which may be manually operated or part of an automated system.

The controller 87 coordinates operation of the ion source 10 and, in particular, operation of the electromagnet 42 with respect to an observable effect of the electromagnet 42 on the beam properties or substrate treatment process. The controller 87 may include a programmable logic controller ("PLC"), a digital signal processor ("DSP"), or another microprocessor-based controller with a central processing unit capable of executing software stored in a memory and carrying out the functions described herein, as will be understood by those of ordinary skill A human machine interface ("HMI") device (not shown) is operatively connected to the controller 87 in a known manner. The HMI device may include output devices, such as alphanumeric displays, a touch screen, and other visual indicators, and input devices and controls, such as an alphanumeric keyboard, a pointing device, keypads, pushbuttons, control knobs, etc., capable of accepting commands or input from the operator and transmitting the entered input to the central processing unit of controller 87. The controller 87 may be provided with standard communications busses compatible with other automated equipment utilized in a production line.

The controller 87 may contain an algorithm to adjust the current supplied to one or both of the wire coils 72, 74. In one embodiment, the algorithm may determine the amount of electromagnet current adjustment based on considerations such as the radial effects of the electromagnet 42, acquired performance data as a function of electromagnet current settings, and/or previous magnet current settings to the wire coils 72, 74. In another embodiment, the algorithm may be derived from an experimental matrix (for example, a lookup table) as described in the Examples below. In yet another embodiment, the electromagnet 42 may be regulated by an artificial intelligence circuit employing fuzzy logic and performance data acquired as a function of the electromagnet current settings. In one alternative embodiment, the controller 87 may be directly connected to equipment (for example, an array of Faraday probes) that measures an etch depth or ion beam current density distribution, which allows the controller 87 to automatically adjust the current in response to detecting an undesirable etch depth or beam current density distribution.

The electromagnet 42 generates a magnetic field 75, which includes magnetic induction lines diagrammatically shown in FIG. 1, and having a magnetic field strength that is approximately proportional to the current supplied to the wire coils 72, 74. The magnetic field 75, which is azimuthally symmetrical about the azimuthal axis 19, changes the plasma density distribution in the discharge space 24 and, in turn, alters the ion current density uniformity of the ion beam 15. The magnetic field 75 is significantly inhomogeneous, having a maximum field strength in the region between the respective open ends 51, 53 of the pole pieces 46, 48, and diminishing with distance from the open ends 51, 53 such that a minimum field strength is proximate the grid 38 and the coil antenna 26. The magnetic field lines may be concentrated around the azimuthal axis 19, which indicates that the magnetic field strength increases in this region of the discharge space 24. Hence the magnetic field 75 may act on plasma electrons arriving from the peripheral regions as a magnetic mirror. Such a magnetic field configuration may allow plasma density distribution modifications with minimum RF ionization efficiency reduction (i.e., the region of the discharge space 24 characterized by low field strength near the coil antenna 26) and with minimum ion optic operation distortion (i.e., the region of the discharge space 24 characterized by low field strength near the grid assembly 32).

The magnetic field 75 directly influences the plasma density distribution in the ion source 10 and, therefore, the plasma ion flux distribution directed from the plasma 17 to a grid plane that is defined by the grid assembly 32. In this manner, the magnetic field 75 generated by the electromagnet 42 influences the characteristics of an ion beam etch depth or current density distribution on the substrate 11. Ion beam etch profile is a measure of the dependence of the etch depth (for example, thickness change) as a function of a positional coordinate (for example, radius) across a surface of the substrate 11 after etching by ion beam 15 extracted from the ion source 10. After the etching process is complete (or, alternatively, after partial completion of the etching process), a representative ion beam etch depth distribution, herein referenced as the "etch profile," may be generated from a measurement of the thickness change in the etched material as a function of the positional coordinate of substrate 11 (e.g., along the substrate diameter) or the etch rate of the material with respect to the azimuthal axis 19. Alternatively, after the above-mentioned etching interval, an average thickness change distribution may be assessed and based upon a statistical average of individual thickness change distributions measured on the same substrate and/or more than one substrate.

More generally, the beam ion flux distribution, herein references as the "beam density distribution" or "beam profile," may be determined with a plurality of Faraday probes (not shown) that are operable to directly measure the ion beam current density during operation of the ion source (for simplicity, the case of a single ion charge state is assumed here such that the ion flux and current density distributions are equivalent; however appropriate equipment modifications to resolve current density distributions of individual ion charge states by a similar same method may be used for multiple charge state ion beams). The Faraday probes, which are spatially arranged to permit determination of the ion beam current density distribution with respect to the azimuthal axis 19, are inserted along a path of the ion beam 15 and at a position that is proximate the substrate processing location. Charge is accumulated by each Faraday probe, for a time interval, and current measurements are calculated. The Faraday probes may be coupled with the controller 87, which supervises the insertion of the Faraday probes into the path of the ion beam 15 and the acquisition of the current measurements.

When the spacing, size, and distribution of the apertures 77 in the grid assembly 32 are relatively uniform, a concave or convex plasma ion flux distribution in the ion source 10 will result in a concave or convex ion beam profile between the ion source 10 and the substrate 11. However, the beam profile may tend to be more uniform (less concave or convex) than the plasma ion flux distribution due to divergence and overlap of individual beamlets. An ideal concave beam ion current density profile is defined here as having a maximum ion current density at the edges of the ion source 10 (i.e., further from the azimuthal axis 19) and decreasing in magnitude from the edges to the center of the ion source 10; an ideal convex beam profile is defined exactly in the reverse manner (i.e., a maximum ion current density at the azimuthal axis 19). While actual ion beam current density distributions may be more complex than these ideal cases, it is useful to generally define a "concave beam profile" as one in which there is a substantially greater ion beam current average density outside of the central half of the beam diameter of interest, and a "convex beam profile" in which there is a substantially greater average current density within the central half of the beam diameter of interest. When the ion beam is normally incident onto the surface of the substrate 11, assuming the surface of the substrate 11 is relatively smooth and flat (i.e. any surface irregularities are negligible compared to the etch depth), the etch profile in the substrate 11 obtained as a result of the ion erosion from the ion beam is similar to the ion beam profile and is readily measurable to the desired accuracy with the usual equipment available to a user of the ion beam processing system.

Figure 3A:
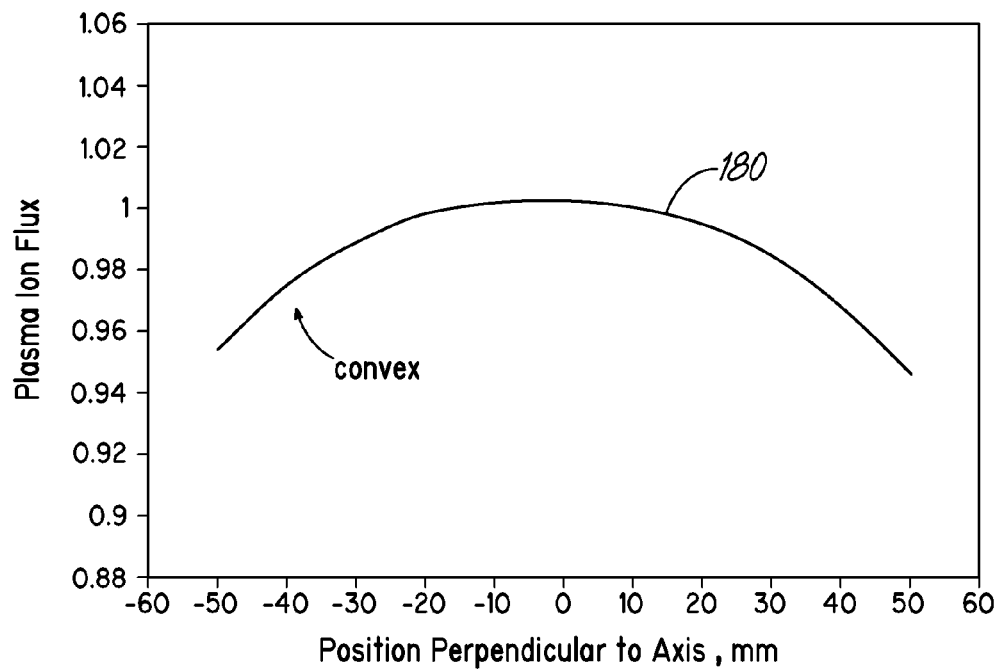
FIG. 3A is a diagrammatic view of the plasma ion flux as a function of radial position relative to the azimuthal axis for the ion source and electromagnet assembly of FIGS. 1 and 2 in which the ion flux is relatively high near the azimuthal axis of the ion source.

FIG. 3A is a diagrammatic illustration of a plasma ion flux distribution 180 at the grid plane 32 for an ion beam 15, such as may be produced by the ion source 10 of FIGS. 1 and 2. The ion flux profile 180 has a radial distribution that is convex about the azimuthal axis 19 (i.e., an origin at a position perpendicular to the axis labeled with "0"). Although not wishing to be limited by theory, it is believed that the volumetric, inhomogeneous magnetic field 75 introduced by the electromagnet 42 may have two distinct effects on the radial distribution of the ion flux that correspond to two different trends in the effect on the etch profile. At low magnetic field strengths (i.e., low electromagnet currents in coils of the electromagnet), the magnetic field 75 is believed to magnetize the plasma electrons primarily near azimuthal axis 19, which confines the plasma electrons to long helical orbits around the magnetic induction lines and, hence, increases the working gas ionization efficiency in this region. This results in the convex distribution for profile 180 in which the ion flux is higher at or near the azimuthal axis 19 and decreases with increasing radial distance from the azimuthal axis 19. The resulting convex distribution in the ion flux profile 180 may be centered on the azimuthal axis 19 and may also be symmetrical about the azimuthal axis 19, although the present invention is not so limited.

In one embodiment, the ion source 10 may be configured to produce the ion flux profile 180 at low levels of current to the wire coils 72, 74. In this mode of ion source operation, the radial distribution of the plasma ion flux arriving at the grid plane of the grid assembly 32 is convex.

Figure 3B:
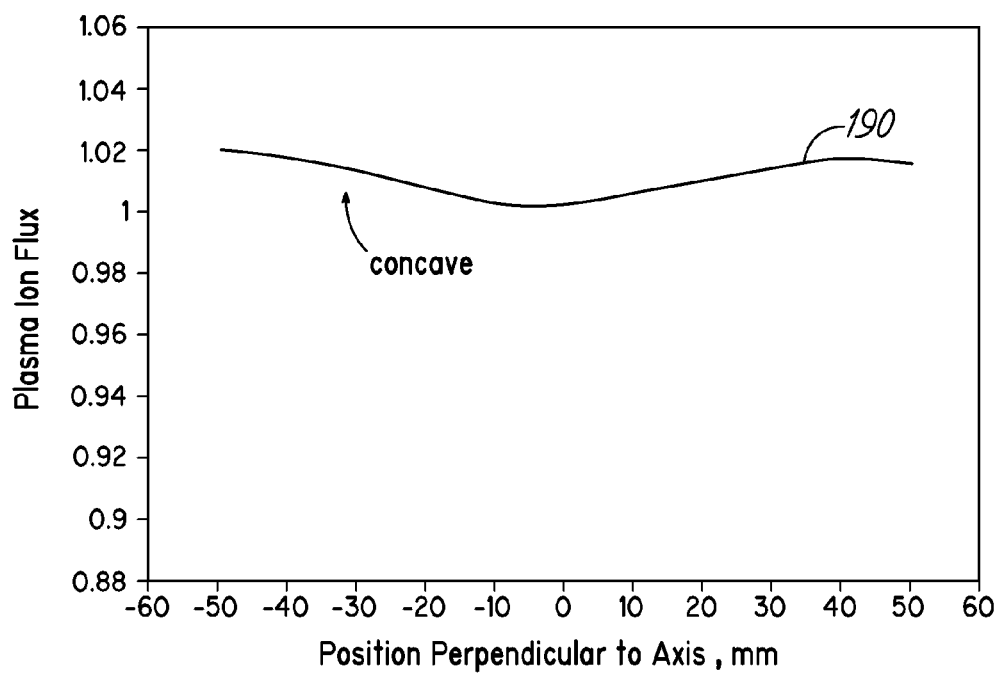
FIG. 3B is a diagrammatic view of a the plasma ion flux for an ion source and electromagnet assembly of FIGS. 1 and 2 in which the ion flux is relatively low near the azimuthal axis of the ion source.

FIG. 3B is a diagrammatic illustration of a plasma ion flux profile 190 at the grid plane 32 for ion beam 15 that may be produced by the ion source 10 of FIGS. 1 and 2. The ion flux profile 190 has a concave radial distribution about the azimuthal axis 19. At higher magnetic field 75 strengths (i.e., higher currents circulating in wire coils 72, 74), some of the hot plasma electrons arriving from the coil vicinity are believed to be reflected from the plasma generator mirroring magnetic field regions toward the periphery of the discharge space 24, such as near azimuthal axis 19 and open ends 51, 53 (i.e., poles). As a result, the working gas ionization efficiency is believed to be reduced in the plasma generator center (i.e., near azimuthal axis 19 of ion source 10) and to be increased at the periphery. The radial distribution of the plasma ion flux arriving at the grids 34, 36, 38 may become less convex in comparison with the original magnetic field free distribution. This results in the concave distribution exhibited by profile 190 in that the plasma ion flux is lower at or near the azimuthal axis 19 and increases with increasing radial distance from the azimuthal axis 19. The convex distribution in ion flux profile 190 may be centered on the azimuthal axis 19 and may also be symmetrical about the azimuthal axis 19, although the invention is not so limited.

With renewed reference to FIGS. 1 and 2, the magnet current to the wire coils 72, 74 of the electromagnet 42 the ion source 10 may be adjusted to produce a magnetic field 75 adequate to provide a desired etch profile. A useful operating range of the electromagnet 42 may depend on other aspects of the design of the ion source 10, as well as upon the specific etch process conditions and the desired etch profile. The grid assembly 32, which supply the ion optics in the representative embodiment, may be designed with variable transparency to optimally utilize the electromagnetic tuning capability. For example, the adjustable transparency for the grid assembly 32 can be achieved by varying the density of the apertures 77 in the grid assembly 32 and/or varying the size of the apertures 77 across the grid assembly 32. Manipulating either of these variables pertaining to the apertures 77 may adjust the distribution of ion current emitted across the width of the grid assembly 32 and, ultimately, the shape of the beam profile and the etch depth profile at the substrate 11.

The magnetic field 75 of the electromagnet 42 may be varied while processing an individual substrate or between sequential substrates treatments so as to control the ion beam current density distribution and maintain the desired substrate etch rate or etch depth distribution. This variation may include monitoring the ion beam current density distribution ("beam profile") or substrate etch rate or etch depth distribution ("etch profile"), either in-situ or ex-situ, and tuning or varying the magnetic field 75 to achieve a targeted beam current density distribution and/or etch profile at the substrate 11. For in-situ monitoring, the hardware that is monitoring the substrate etch profile or the beam profile is disposed inside the process chamber 12a, which provides the option of continuous monitoring and real time adjustments. In an alternative embodiment, this feature may be carried out by monitoring the substrate etch profile "semi-in-situ," i.e., the ion source remains under vacuum while substrate etch profile is obtained from a measurement station incorporated as part of a configuration of vacuum etching equipment. In "semi-in-situ" monitoring, the monitoring system is disposed in the same processing station as ion source 10, but may be positioned in a separate module operably coupled to the process chamber 12a via a vacuum transport system such that the substrate 11 may be transferred without breaking vacuum and the etch profile measured.

To vary the magnetic field 75, the electrical current from the power supply 86 to the wire coils 72, 74 may be varied to selectively control the field strength of the electromagnet 42 and further to selectively modify the plasma density distribution in the discharge space 24. Substrate processing equipment, or a configuration of vacuum etching equipment, may include an automatic electromagnet magnet power supply controller and etch profile measurement system (whether in-situ, ex-situ, or "semi-in-situ") such that the entire operation may be carried out without need for any action by the user.

A hysteresis effect due to residual or remnant magnetization of the soft magnetic pieces, represented by the pole pieces 46, 48 in this construction, may not be negligible compared to the desired range of the source electromagnetic field operation. The hysteresis effect may cause the repeatability of the net magnetic field strength, and thus the etch profile, to be negatively affected. Although the hysteresis effect may be minimized by careful specification of the material of the components, provisions may also be made to reverse the current in wire coils 72, 74 to demagnetize the electromagnet and cancel the remnant magnetic field. In one embodiment, the current to the wire coils 72, 74 is set to zero and an ion beam etch profile is measured. If the ion beam etch profile is determined to show the hysteresis effect, current at a reverse amplitude as that normally used is sent through the wire coils 72, 74. After a time, the reverse current is shut off and another ion beam etch profile is measured. This process may continue with additional iterations until the hysteresis effect is less or not discernible.

With specific reference to FIG. 2, in one embodiment of the present invention a magnetic field probe or sensor 89 may be placed inside of the re-entrant vessel 44 and adjacent to the pole piece 46. For example, the sensor 89 may be positioned in an orientation appropriate to measure the magnetic field strength that perpendicular to the azimuthal axis 19. The sensor 89 may be repositioned within the re-entrant vessel 44 as long as the measured value is at least a large fraction of that reading (e.g., greater than about 50%) and is roughly proportional to that reading over the desired range of magnet currents. When changing magnet current settings, or during a process to eliminate the hysteresis effect, the current to the wire coils 72, 74 may first be switched off and then the remnant field strength magnitude may be measured on the magnetic field sensor 89.

If the remnant magnetic field strength exceeds an acceptable threshold, based upon experimental results or historical performance, a small reverse current may be applied to wire coils 72, 74 with the objective of reducing the remnant magnetic field strength. The small magnet current in wire coils 72, 74 is a fraction of the magnitude and opposite in polarity to that which was most recently applied. The magnet current to the electromagnet 42 may then be switched off and the remnant field magnitude re-measured using magnetic field sensor 89. When the remnant magnetic field strength magnitude remains above the acceptable threshold, the correction process may be repeated and the reverse current adjusted until the remnant field strength magnitude is reduced below the acceptable threshold. When the correction process results in a remnant field of opposite polarity because of overcompensation, the correction process may be reversed. If the magnet current is adjusted to a higher magnitude of the same polarity, there is no impact from the hysteresis effect and the demagnetization operation supplied by the correction process may not be necessary.

The magnetic field sensor 89 may also be useful to provide closed loop control of the magnetic field strength for still further improved process control. In this alternative embodiment, the magnetic field sensor 89 is electrically coupled with controller 87. However, if no magnetic field sensor 89 is incorporated into the ion source 10, then the demagnetization process may still be applied. In this instance, a fixed reverse magnet current strength magnitude may be applied for demagnetization, the value of which is determined by, for example, experiment, and typically limited to a range of about 10% to about 30% of the maximum current employed during the previous process.

Figure 4:
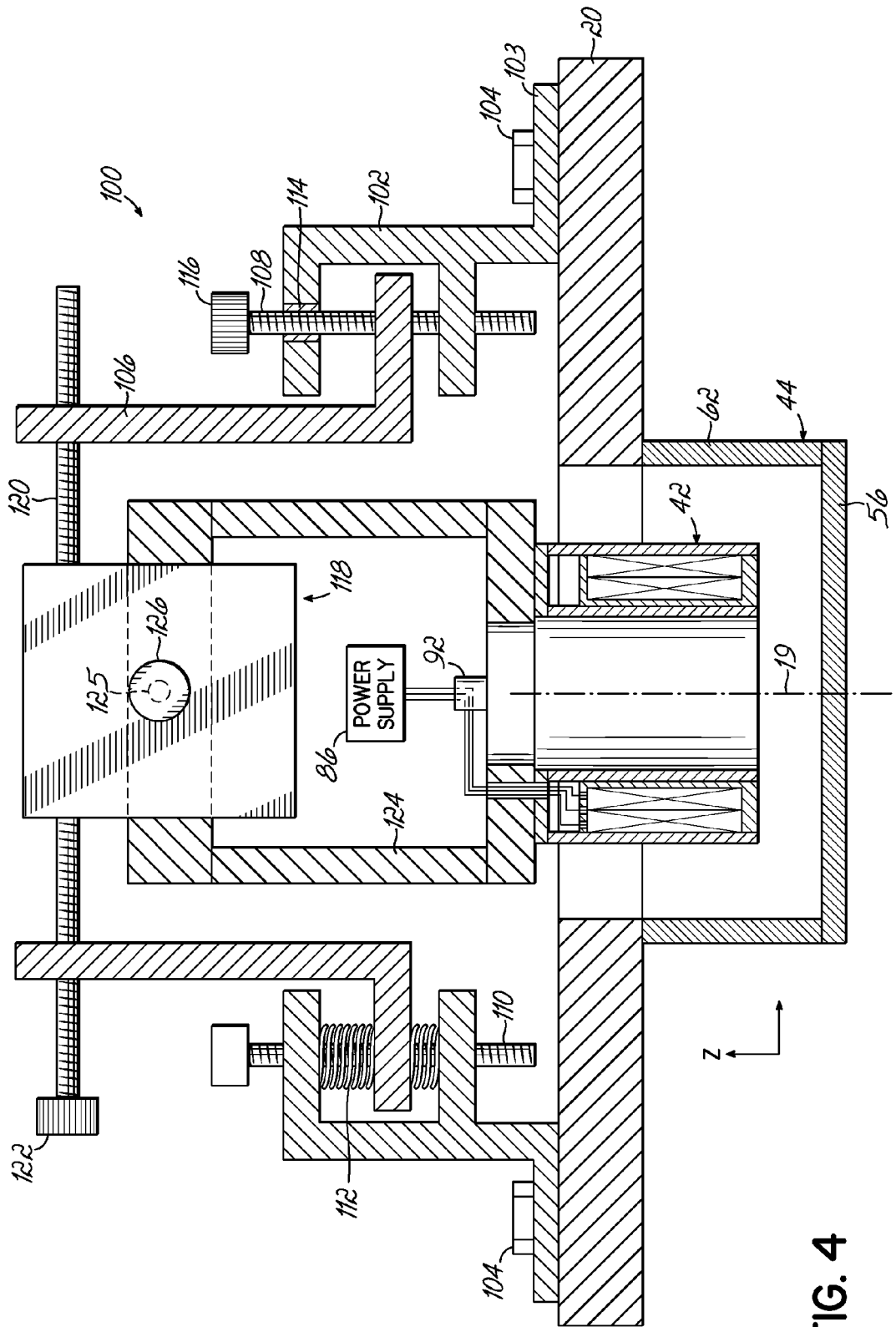
FIG. 4 is an enlarged view, similar to FIG. 2, of an ion source and electromagnet assembly, along with a portion of the processing system, in accordance with an alternative embodiment of the present invention.

With reference now to FIG. 4, and in accordance with an alternative embodiment of the present invention, the ion source 10 may further include a single or multi-stage positioner, generally indicated by reference numeral 100, configured to allow the electromagnet 42 to travel along an axial direction that parallel to the azimuthal axis 19 (as limited by the end wall 56) or to travel laterally (as limited by the diameter of the tubular sidewall 18 of the re-entrant vessel 44). The positioner 100 provides adjustability of the position of the electromagnet 42 with respect to the plasma volume in discharge space 24.

The positioner 100, which mounts the electromagnet 42 to the back flange 20, may include a series of brackets and adjusting mechanisms that permit independent adjustment of the X,Y,Z coordinate position of the electromagnet 42 with respect to the ion source 10 and, in this embodiment, the re-entrant vessel 44. Specifically, the positioner 100 includes a bracket 102, which may be generally cylindrical, having a flange 103 that is mounted to the back flange 20 by a plurality of bolts 104 that may be equally spaced apart on a bolt circle. Another bracket 106 is supported on the bracket 102 by at least one threaded rod 108 and at least one additional support rod 110, which incorporates compliant but structurally supportive spacers 112, such as springs. Where the threaded rod 108 communicates with bracket 102, the threaded rod 108 is supported by a rotary mechanism 114, such as a ball bearing assembly. This rotatable support arrangement permits the location of the bracket 102 to be positioned in parallel with the azimuthal axis 19 (defining a first positioning axis, "Z") by rotating the rod 108 using a thumbscrew 116.

Mounted on bracket 106 is another bracket 118 whose position is adjustable in a lateral direction that is perpendicular to the axis via threaded rod 120 using a thumbscrew 122 (defining a second positioning axis, "X," that is not aligned Z). Another bracket 124 is mounted on bracket 118 via a threaded rod 125 such that the position of the bracket 124 is adjustable in a direction that is generally perpendicular to the two other axes via a thumbscrew 126 (defining a third positioning axis, "Y," that is not aligned with either of X or Z). The electromagnet 42 is mounted to bracket 124.

The (X,Y,Z) positioning axes may comprise a Cartesian coordinate system with mutually orthogonal axes that supply at least three degrees of freedom for positioning the electromagnet 42 relative to the back flange 20. However, it is understood that various other frames of reference may be employed for describing and implementing the motion directions of the brackets 102, 106, 118, 124 in a different frame of reference for positioning the electromagnet 42 relative to the back flange 20.

The positioner 100 may have other mechanical constructions as would be understood by a person having ordinary skill in the art. In an alternative embodiment, the positioner 100 may be automated by, for example, replacing the manually-manipulated thumbscrews 116, 122, 126 with a powered drive system, such as stepper motors, servo motors, or the like, that is electrically coupled with the controller 87. The powered drive system would be operated by electrical signals derived from programmed instructions from, for example, a software algorithm resident on the controller 87.

Figure 5:
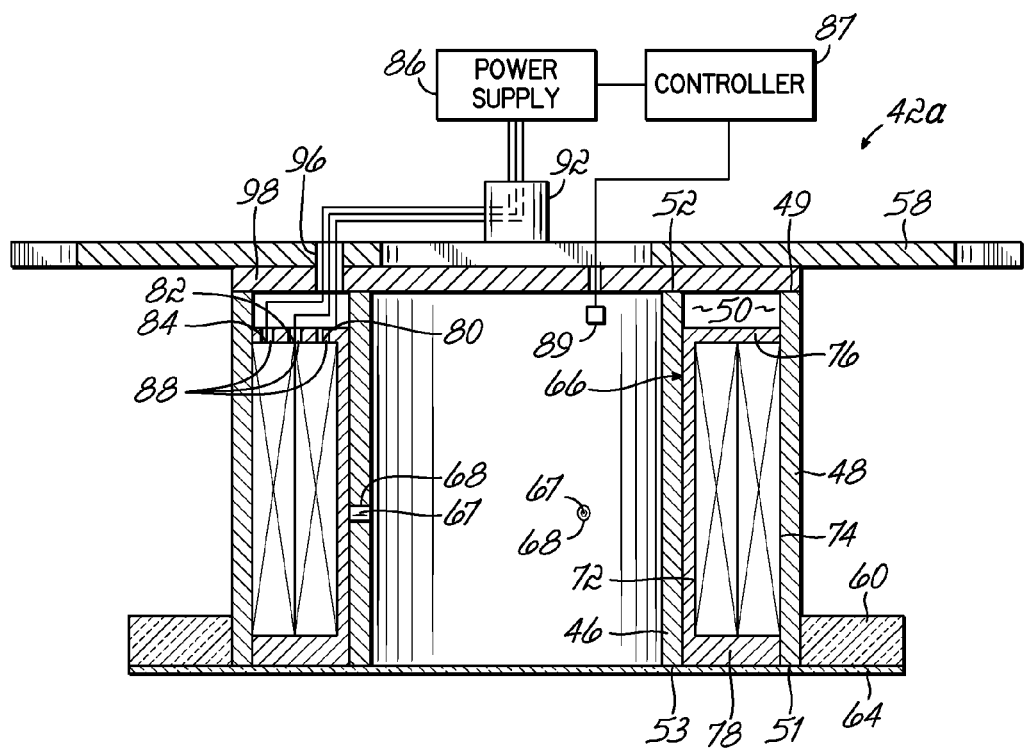
FIG. 5 is an enlarged view, similar to FIG. 2, of an electromagnet assembly in accordance with an alternative embodiment of the present invention.

With reference to FIG. 5 in which like reference numerals refer to like features of FIG. 2 and in accordance with an alternative embodiment of the present invention, an electromagnet 42a modifies electromagnet 42 to include a solid disk-shaped core element 98 coupled with the pole pieces 46, 48 and unbroken but for the wireway 96. Core element 98, which replaces core element 54, bridges the gap between the open end 49 of the second pole piece 48 and the open end 52 of the first pole piece 46. The core element 98 also closes the bore radially inside the open end 52 of the first pole piece 46. The core element 98 is formed from magnetically permeable material and is conventionally fastened to the mounting plate 58.

Figure 6:
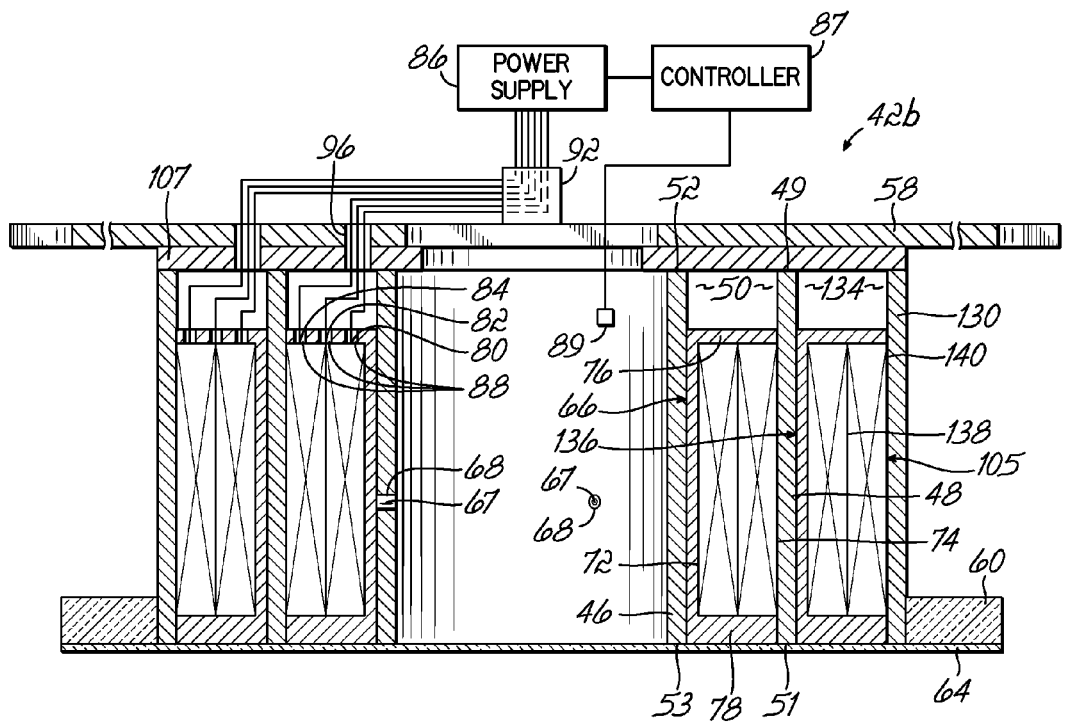
FIG. 6 is an enlarged view, similar to FIGS. 2 and 5, of an electromagnet assembly in accordance with an alternative embodiment of the present invention.

With reference to FIG. 6 in which like reference numerals refer to like features of FIG. 2 and in accordance with an alternative embodiment of the present invention, an electromagnet 42b, which is similar to electromagnet 42a, includes an additional pole piece 130. The pole piece 130 is concentrically arranged with the pole pieces 46, 48 such that the second pole piece 48 is disposed radially between the first pole piece 46 and the additional pole piece 130. The pole pieces 46, 48, 130 extend axially from an annular core element 107. The additional pole piece 130 and the core element 107 may also be formed from a magnetically permeable material, such as low carbon steel, iron, or any other suitable material. Disposed in a gap or open space 134 between the pole pieces 48, 130 are additional wire coils 138, 140 and a wire bobbin or spool 136, which along with wire coils 72, 74 and the wire spool 66 comprise the electromagnet 42a. The wire spool 136 is substantially identical to wire spool 66, and a pair of wire coils 138, 140 are substantially identical to wire coils 72, 74.

The wire coils 138, 140 are disposed at a greater radius relative to azimuthal axis 19 (FIG. 1) than the wire coils 72, 74 of the electromagnet 42 (FIG. 1). The wire coils 138, 140 may be energized independent of wire coils 72, 74 and such that the impact of the magnetic field 75 on plasma 17 (FIG. 1) may be distributed over a larger or smaller diameter relative to azimuthal axis 19. The radial distribution may be contingent upon the etch requirement. The independent field generation may be provided by energizing only coils 72, 74, by energizing only wire coils 138, 140, by switching between one set of wire coils 72, 74 and the other set of wire coils 138, 140, or energizing all wire coils 72, 74, 138, 140 simultaneously while utilizing independent magnet current settings.

In an alternative embodiment, the electromagnet 42b may omit one of the two wire coils 72, 74 and/or one of the two wire coils 138, 140 such that only a single range of operation exists for each coil set. In this alternative embodiment, two taps of the remaining one of the wire coils 72, 74 may be coupled in a closed circuit with the power supply 86 and energized by current from the power supply 86. Similarly, two taps of the remaining one of the wire coils 138, 140 are coupled in a closed circuit with the power supply 86 and energized by current from the power supply 86.

Figure 7:
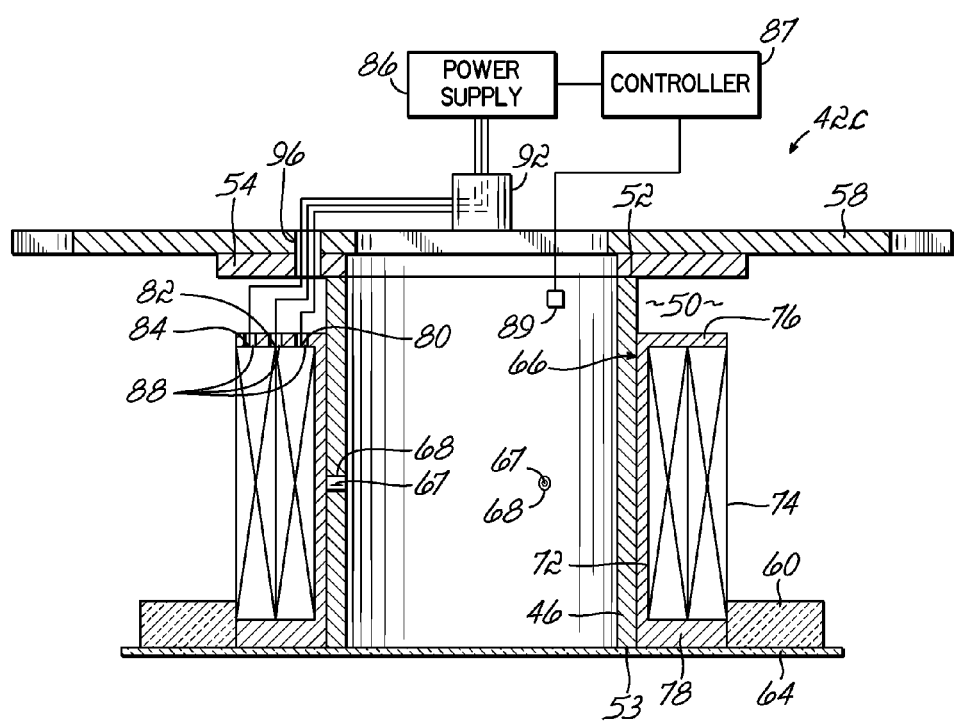
FIG. 7 is an enlarged view, similar to FIGS. 2, 5, and 6, of an electromagnet assembly in accordance with an alternative embodiment of the present invention.

With reference to FIG. 7 in which like reference numerals refer to like features of FIG. 2 and in accordance with an alternative embodiment of the present invention, an electromagnet 42c omits the second pole piece 48 so that the wire coils 72, 74 may be disposed radially outside the first pole piece 46. As a result, the wire coils 72, 74 are radially flanked only on their inner diameter (relative to the azimuthal axis 19 (FIG. 1) by magnetically permeable material that shapes and concentrates the magnetic field emitted from the energized wire coils 72, 74.

Figure 8:
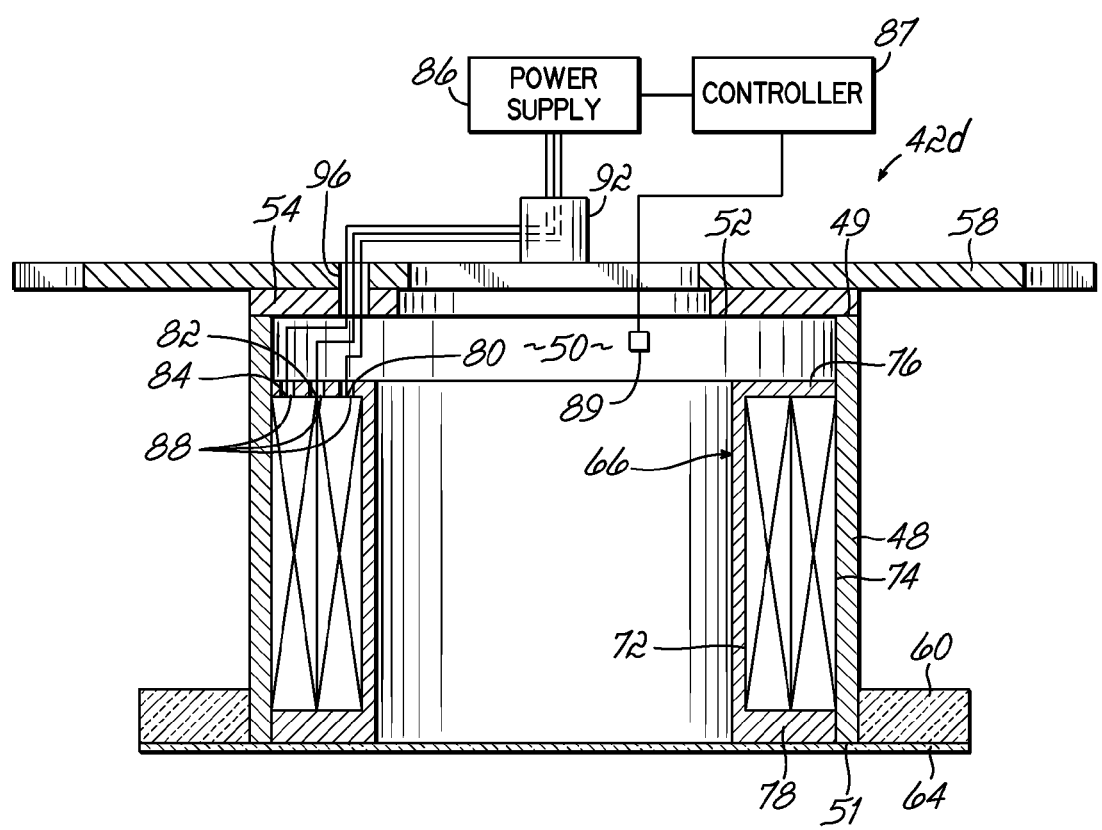
FIG. 8 is an enlarged view, similar to FIGS. 2 and 5-7, of an electromagnet assembly in accordance with an alternative embodiment of the present invention.

With reference to FIG. 8 in which like reference numerals refer to like features of FIG. 2 and in accordance with an alternative embodiment of the present invention, an electromagnet 42d omits the first pole piece 46 so that the wire coils 72, 74 may be disposed radially inside the second pole piece 48. As a result, the wire coils 72, 74 are radially flanked only on their outer diameter (relative to the azimuthal axis 19) by magnetically permeable material effective to shape, direct, and concentrate the magnetic field emitted from the energized wire coils 72, 74.

Further details and embodiments of the invention will be described by way of the following examples.

Example 1

An ion source having an electromagnet assembly, otherwise substantially identical to electromagnet 42b (FIG. 6), but with each of the inner and outer coils including a single coil of 970 turns, was equipped with an ammeter between the coil of the radially innermost electromagnet and the power supply so as to measure the current supplied to the radially outermost coil of this electromagnet. The coil of the radially outermost electromagnet was disconnected from the power supply so that only the innermost coil of the electromagnet was energized. An electrical probe was inserted into the beam and situated in the substrate plane that was perpendicular to the beam incidence direction. A voltage was measured from the electrical probe, which was charged under the substrate processing conditions. This voltage was considered as a measure of the broad ion beam neutralization.

A 1200 V, 650 mA beam of positively charged ions was extracted from an argon (Ar) gas plasma. While propagating toward the substrate, the ion beam was neutralized utilizing a plasma bridge neutralizer. A series of silicon oxide (SiO) coated silicon substrates were etched at normal incidence at different ion source electromagnet current settings, $I_{mag}$. The electromagnet current setting, $I_{mag}$, was systematically varied in 0.1 A increments. The ion beam from the ion source was directed at normal incidence to a statically held substrate to etch a portion of the SiO layer. The etch rate at different locations on the substrate was calculated as the ratio of the measured etch depth (change in the oxide layer thickness) to etch time. The relative etch rate, indicated in Table 1, represents the average etch rate divided by the average etch rate with a zero magnet coil current. It is advantageous to measure an etch rate with a value of zero magnet coil current before developing any knowledge of the effect of the electromagnet at the chosen process parameters and ion source etching system configuration. The change in SiO layer thickness was determined by pre- and post-etch optical spectrophotometry measurement. The RF power and the probe voltage were measured for each value of the magnet current, $I_{mag}$ and normalized to the corresponding values at zero magnet coil current. The probe voltage is representative of the level of neutralization of the broad ion beam.

TABLE 1

| $I_{mag}$ (A) | Uniformity (3 σ/Avg) | Relative Etch Rate (μm/min) | Relative RF Power (kW) | Relative Probe Voltage (V) |
|---|---|---|---|---|
| 0.0 | 2.19% | 1.00 | 1.00 | 1.00 |
| 0.1 | 3.13% | 1.00 | 1.01 | 1.03 |
| 0.2 | 3.32% | 1.01 | 1.03 | 1.04 |
| 0.3 | 5.85% | 1.08 | 1.07 | 1.09 |
| 0.4 | 6.11% | 1.09 | 1.06 | 1.04 |
| 0.5 | 4.83% | 1.07 | 1.06 | 1.04 |
| 0.6 | 4.57% | 1.08 | 1.09 | 1.09 |
| 0.7 | 4.25% | 1.07 | 1.12 | 1.09 |
| 0.8 | 3.68% | 1.06 | 1.13 | 1.10 |
| 0.9 | 3.21% | 1.05 | 1.16 | 1.13 |
| 1.0 | 3.70% | 1.05 | 1.17 | 1.10 |
| 1.2 | 1.56% | 1.00 | 1.18 | 1.12 |
| 1.3 | 1.30% | 1.00 | 1.18 | 1.19 |
| 1.4 | 1.30% | 0.98 | 1.19 | 1.17 |

As indicated in Table 1, one metric for evaluating the shape of the etch depth profile, which is appropriate when it is desired to etch the substrate uniformly, is the "three sigma" etch rate "uniformity" (three times the standard deviation from the mean or average value divided by the mean) variation in the etch rate, which expressed as a percentage. As apparent from the tabulated data, etch rate uniformity worsened as the magnet current was raised from 0.0 A to 0.4 A. Above 0.4 A, the etch rate uniformity progressively improves as the magnetic field flattens the etch profile. As apparent from the tabulated data, the etch uniformity at magnet currents of 1.2 A, 1.3 A, and 1.4 A was improved in comparison with the etch uniformity at an electromagnet current of 0.0 A. The high degree of etch uniformity that can be achieved by this method (less than 3% three sigma) on statically held substrates indicates that when electromagnet assembly is tuned, the introduction of an external magnetic field via the electromagnet of the invention smoothes out local variations in the plasma density.

As is apparent from Table 1, the measured etch rate is weakly dependent on the electromagnet current. There is a slight effect, which can be compensated, if required, for example, by appropriate adjustment of the etch time. This effect may also be usefully employed to tune the etch rate of the ion source rather than the etch profile, for example, to match the etch rate in one module with another, although the practical use of such a method would depend on the sensitivity of the process to the resulting change in the etch profile. The presence of the magnetic field from the magnet assembly increases the RF power with increasing field strength (i.e., increasing electromagnet current). However, the observed increase in the RF power can be tolerated without a significant reduction in source efficiency over the entire range of electromagnet currents.

The uniformity in the etch rate profile can be related to the shape and/or uniformity of the ion beam that is used to generate the etch profile. As a result, the variation in the profile of the ion beam is linked to the shape of the etch rate or etch depth profile.

Example 2

As evidence that the operation of the electromagnet under controlled conditions does not degrade the ion beam directionality, the "local divergence angle" of the angular distribution of the ions was evaluated for optimum electromagnet current settings at different positions in the beam and compared with equivalent results obtained without the electromagnet using the same process parameters. The "local divergence angle" was determined by etching a substrate beneath a masking aperture and measuring the size of the etch spot, essentially as described by J. R. KAHN et al., "Methods of operating an electromagnet of an ion source," *J. Vac. Sci. Technol. A* 14(4), Jul/Aug 1996, p. 2106-2112, except that a silicon dioxide ($SiO_2$) coated silicon substrate was used as the substrate and a nanospectrophometric measurement apparatus (NANOMETRICS NANOSPEC 8000) capable of high resolution etch depth and lateral position measurement was used to determine the etch depth profile. The disclosure of this publication is hereby incorporated by reference herein in its entirety. The substrate was etched using the ion source of Example 1 operating at a magnet current of 1.3 A.

As shown in Table 2, the divergence angle was evaluated at two different positions on the etched silicon dioxide layer, both at normal incidence to the beam and downstream of the grid plane by about 9 inches. One position is at radius R=0.0 inches on the center axis of the beam, and the second position is at radius R=2.5 inches, which is offset from the center of the beam by 2.5 inches. The estimated error of the divergence angle measurements is about ±0.5°. As shown in Table 2, there is no evidence of significant degradation of the beam directionality arising from electromagnet operation for the chosen operating conditions.

TABLE 2

| Beam Voltage (Volts) | Beam Current (mA) | Relative Local Divergence Angle With electromagnet (optimized magnet current) | |
|---|---|---|---|
| | | R = 0 (center) | R = 2.5" |
| 100 | 180 | 0.95 | 0.95 |
| 100 | 270 | 1.05 | 1.00 |
| 1200 | 650 | 0.93 | 1.00 |

Example 3

Figure 9:
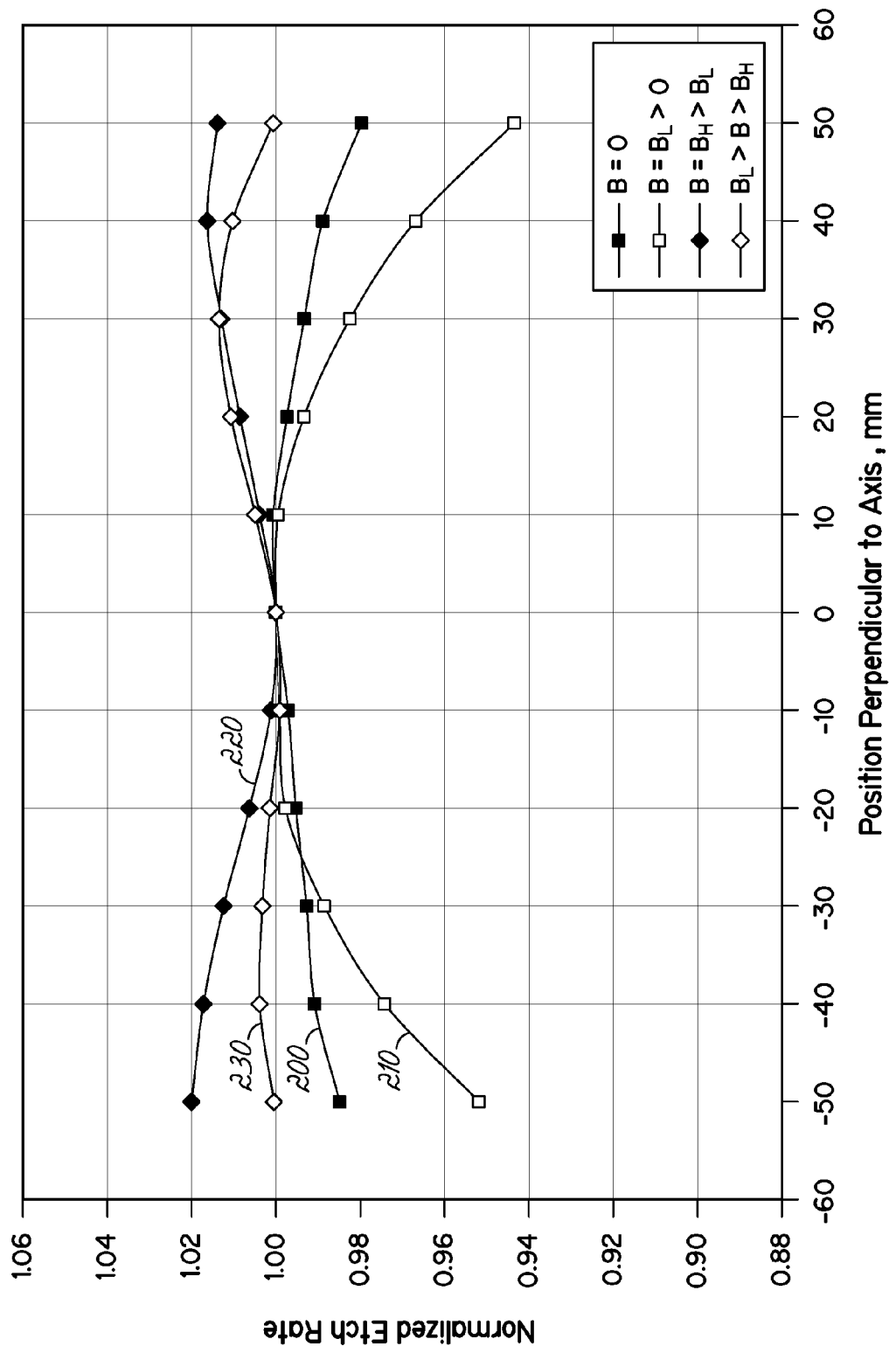
FIG. 9 is a diagrammatic view illustrating the effects of the electromagnetic field generated by an ion source of an embodiment of the invention on the normalized ion beam etch rate profile.

A series of ion etch profiles, which have been normalized for presentation, were generated using the ion source and operating parameters (except for the current applied to the electromagnet) of Example 1 and are shown in FIG. 9. With no current applied to the coils of the electromagnet (and therefore no field strength), the plasma density distribution and the distribution of plasma ion flux are characterized by a convex profile, which is reflected in the ion etch profile of curve 200. At a relatively low field strength, $B_L$, the plasma density distribution and the distribution of plasma ion flux increase in convexity with increasing field strengthen, as reflected in the ion etch profile of curve 210. At a relatively high field strength, $B_H$, the plasma density distribution, and the distribution of plasma ion flux changes shape to become more concave with increasing field strength. Eventually, the plasma density distribution and the distribution of plasma ion flux change to a concave shape, as reflected in the ion etch profile of curve 220.

At a particular magnetic field strength, B, which ranges from $B_L$ to $B_H$, the plasma density distribution and the distribution of plasma ion flux will be substantially flat, i.e. not convex or concave, as reflected in the etch profile of curve 230. This behavior allows the overall shape of the etch profile, as well as the plasma density distribution and the distribution of plasma ion flux, to be tailored to a desired shape, and in particular, is very favorable to being able to produce very uniform etching characteristics. As compared to prior art RF ion beam source control method embodiments, the capability of the ion source of the present invention to tailor the plasma density distribution using an electromagnetic field potentially allows it to be used over a wider range of beam parameters, or to be used with different grid designs, or achieve a wider range of desired beam profiles.

Example 4

The following is an example of how the magnetic field generated by the electromagnet may be used to "re-tune" the ion beam density profile for a given ion beam processing configuration so as to re-optimize it for the effects of variation in the operating conditions. "Ion beam processing configuration" refers to the ion beam processing system design and operating parameters. The "ion beam processing system design" includes the mechanical and electrical configurations of the ion beam processing system components, including the ion source embodiment 10 (FIG. 1), the grid assembly design, the process chamber 12a, and the vacuum pumping system design. "Operating parameters" here refers to all of the equipment settings, including the ion beam grid voltages, the beam current, the etch angle, and the gas flow rate and processing area of interest (e.g., usable substrate diameter) other than the electromagnetic setting itself. "Operating conditions" refer to the particular set of circumstances that can affect the density profile associated with any particular processing tool at any particular time. For example, variations may be due to the tolerance variations in the construction of the specific ion generator unit (e.g., the plasma source), including the particular electromagnet unit, the specific unit grid set, and the particular process chamber, including the specific vacuum pump. Alternatively, the variations may be due to the "aging" effects on these components since they were first installed and last serviced. The electromagnet current, $I_{mag}$, may be optimized initially by generating a knowledge base of the typical relative influence of the electromagnet 42 for a particular ion beam configuration operated at a reference set of operating conditions. The knowledge base may be used to select a nominal value for the electromagnet current, $I_{nom}$, likely to achieve a desired ion beam etch rate profile at the reference conditions.

Figure 10:
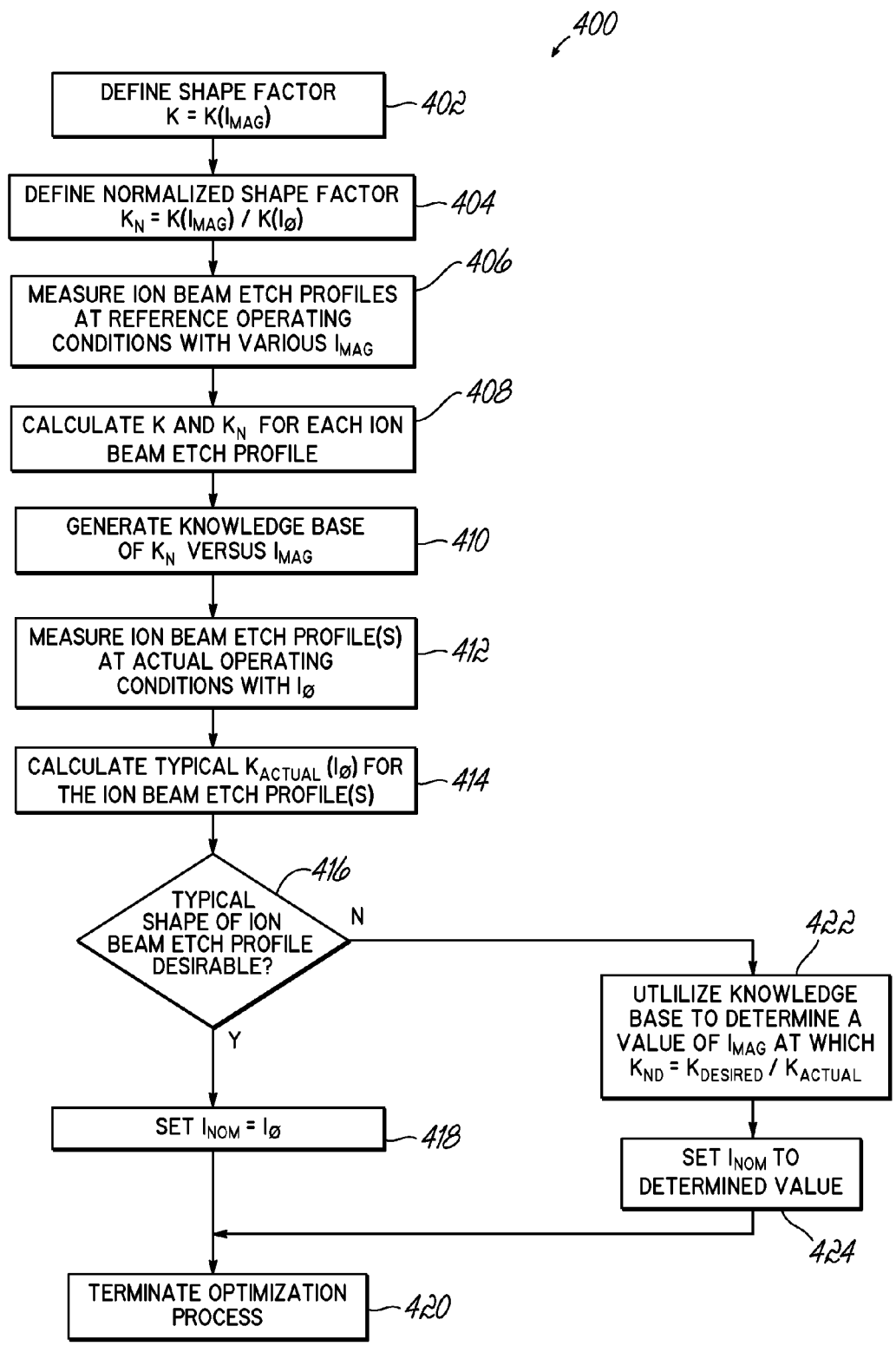
FIG. 10 is a flowchart of a process for optimizing the electromagnet current for an ion source with an electromagnet in accordance with an embodiment of the present invention.

FIG. 10 is a flow chart illustrates a method 400 that may be used to optimize the electromagnet current, $I_{mag}$, for ion source 10 (FIG. 1) for other operating conditions in accordance with an embodiment of the present invention. In block 402, a distribution profile in the representative form of a shape factor, K, is defined as a measure of the convexity or concavity of the ion beam etch profile. This shape factor may be, for example, the ratio of the average ion beam current density in the beam for measured points within a certain inner radius "$r_0$" to the average current density for measured points at radii between $r_0$ and the maximum usable radius. The shape factor, K, may be defined to correspond to unity when there is a substantially flat etch profile, a value greater than one (K>1) corresponding to an increasingly convex etch profile, and a value less than one (K<1) corresponding to an increasingly concave etch profile. For a given ion beam processing configuration and a given set of operating parameters, K, may be provided as a function of $I_{mag}$ (i.e., $K=K(I_{mag})$) for a reference set of conditions.

In block 404, a normalized shape factor, $K_N$, is defined as a value of K at each different electromagnet current, $I_{mag}$, divided by K at a reference electromagnet current, J. The reference electromagnetic current, $I_0$, may be defined as zero current, corresponding to a state in which the electromagnet is turned off. The normalized shape factor, $K_N$, may thus be defined as follows:

$$K_N = \frac{K(I_{mag})}{K(I_0)}$$

In block 406, ion beam etch profiles of the ion source 10 (FIG. 1) are measured at reference operating conditions with various values of electromagnet current, $I_{mag}$. In one embodiment of block 406, substrates 11 (FIG. 1) are etched with the ion source 10 (FIG. 1) with reference operating conditions at various values of electromagnet current, $I_{mag}$, the resultant ion beam etch profiles of each substrate are measured and each ion beam etch profile associated with its corresponding electromagnet current, $I_{mag}$. In an alternate embodiment, a plurality of Faraday probes may be used to directly measure a spatial distribution for the ion beam current density profile of the ion source 10 (FIG. 1) with reference operating conditions and at various values of electromagnet current, $I_{mag}$. In block 406, one value of electromagnet current, $I_{mag}$, may be chosen as the reference electromagnet current, $I_0$. In block 408, values for the shape factor, K, and the normalized shape factor, $K_N$, are calculated for each ion beam etch profile measured in block 406. The controller 87 may be used to calculate the values for the shape factor, K, and the normalized shape factor, $K_N$, for each ion beam etch profile.

Figure 11:
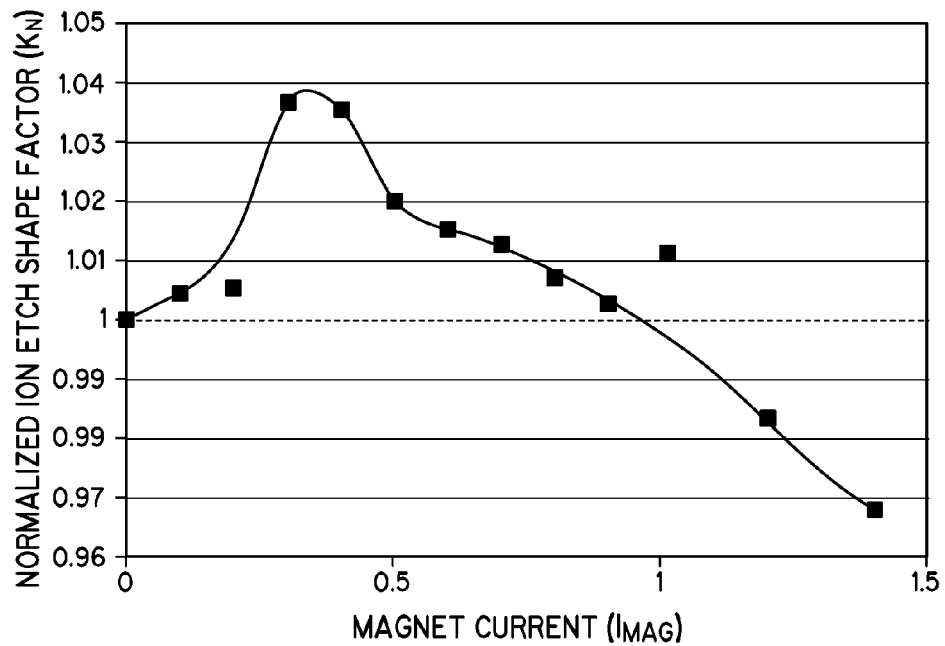
FIG. 11 is a graphical representation showing the convexity and concavity of a normalized ion beam etch profile as a function of magnet current.

In block 410, a knowledge base that contains information pertaining to the relative effect of electromagnet current on the ion beam etch rate profile for a given ion beam processing system and set of operating parameters is generated. The knowledge base may take the form of a table or a graphical representation (i.e., such as shown in FIG. 11 and described later). The knowledge base may reside in a memory of the controller 87.

In block 412, one or more ion beam etch profiles of ion source 10 (FIG. 1) are measured at the reference electromagnet current value, $I_0$, under "actual" operating conditions corresponding to the particular ion beam processing unit and the particular condition at the time of interest. In block 414, an actual shape factor, $K_{actual}(I_0)$, is defined as the value of the shape factor, K, at the reference electromagnet current, $I_0$, with actual operating conditions. In block 416, the actual shape factor, $K_{actual}(I_0)$, is evaluated to determine whether it indicates that the ion beam etch profile is within desired limits at $I_0$ (i.e., if $K_{actual}(I_0)$, is approximately unity, indicating the ion beam etch profile is neither essentially concave nor convex, where a uniform etch process is desired). When $K_{actual}(I_0)$ indicates the ion beam etch profile is desirable at the reference current, $I_0$, the nominal electromagnet current, $I_{nom}$, is set to the reference electromagnet current, $I_0$, that is, $I_{nom}=I_0$, in block 418. In block 420, the method 400 for electromagnet current optimization is terminated.

The controller 87 (FIG. 1) may be used to perform the process optimizing the electromagnet current. The controller 87 (FIG. 1) may make the evaluations of actual and desired shape factors based upon a suitable algorithm executing on the CPU of the controller 87 (FIG. 1).

When the actual shape factor, $K_{actual}(I_0)$, at the reference current, $I_0$, indicates an undesirable ion beam etch profile is obtained at the reference current (i.e., $K_{actual}(I_0)$ is not approximately unity when a uniform etch process is desired), the knowledge base obtained from the reference conditions is utilized to determine a setting of the electromagnet current, $I_{mag}$, that results in a desirable ion beam etch profile in block 422 (thus avoiding the needed to re-evaluate the shape factor at different magnetic currents to optimize the density profile for the actual operating conditions). The knowledge base may be utilized to find a value of the electromagnet current, $I_{mag}$, at which a desired normalized shape factor, $K_{ND}$, is equal to the ratio of the desired shape factor, $K_{desired}$, divided by the actual shape factor at the reference current, $K_{actual}(I_0)$. Generally, the desired shape factor, $K_{desired}$, will be equal to unity when a uniform etch process is desired, although the invention is not so limited. The desired normalized shape factor, $K_{ND}$, may be defined as follows:

$$K_{ND} = \frac{K_{desired}}{K_{actual}(I_0)}$$

FIG. 11 is a graphical representation of a knowledge base of the relative effect of magnet current on ion beam etch profiles, and graphically illustrates the relationship between the electromagnet current, $I_{mag}$, and the normalized shape factor, $K_N$. This graphical representation may be utilized to reference the value of electromagnet current, $I_{mag}$, at which the desired shape factor, $K_{ND}$, is equal to $K_{desired}/K_{actual}(I_0)$, that is $K_{desired}$ is equal to unity when a uniform etch process is desired. When the resultant value of the electromagnet current, $I_{mag}$, is not within the practical range of operation of the electromagnet 42 (FIG. 1) or the power supply 86 (FIG. 1), the nominal electromagnet current, $I_{nom}$, may be set to the value for which the normalized shape factor, $K_N$, is closest to (i.e., resembles) the desired normalized shape factor, $K_{ND}$. When there is more than one value of the electromagnet current, $I_{mag}$, or the normalized shape factor, $K_N$, that results in a desirable etch profile, any electromagnet current, $I_{mag}$, that provides this condition may be chosen for the nominal electromagnet current, $I_{nom}$.

For example, the knowledge base illustrated in FIG. 11 may be referenced to find the nominal electromagnet current, $I_{nom}$, when the actual shape factor, $K_{actual}(I_0)$, is equal to 0.98 (indicating, for example, that the ion beam etch rate profile is concave) and the desired shape factor, $K_{desired}$, is equal to 1 (when a uniform etch process is desired) at $I_0$. The desired normalized shape factor, $K_{ND}$, is thus calculated to be $K_{ND}=1.0/0.98$, or the desired shape factor, $K_{ND}$, would equal 1.02. As shown in FIG. 11, there are at least two values of the electromagnet current, $I_{mag}$, in the database that correspond to a normalized shape factor of 1.02. Either of these values of the electromagnet current, $I_{mag}$, may be chosen (i.e., $I_{mag}$ may be set to 0.345 A or to 0.5 A) as the nominal electromagnet current, $I_{nom}$, and be considered to result in the substantially flat etch rate profile in which a uniform etch process is desired.

Referring back to FIG. 10, in block 424, the nominal electromagnet current, $I_{nom}$, is set to the electromagnet current, $I_{mag}$, at which the desired shape factor, $K_{ND}$, is equal to $K_{desired}/K_{actual}$ to optimize the flatness of the ion beam etch profile. In block 420, the process for electromagnet current optimization is terminated.

Example 5

Figure 12:
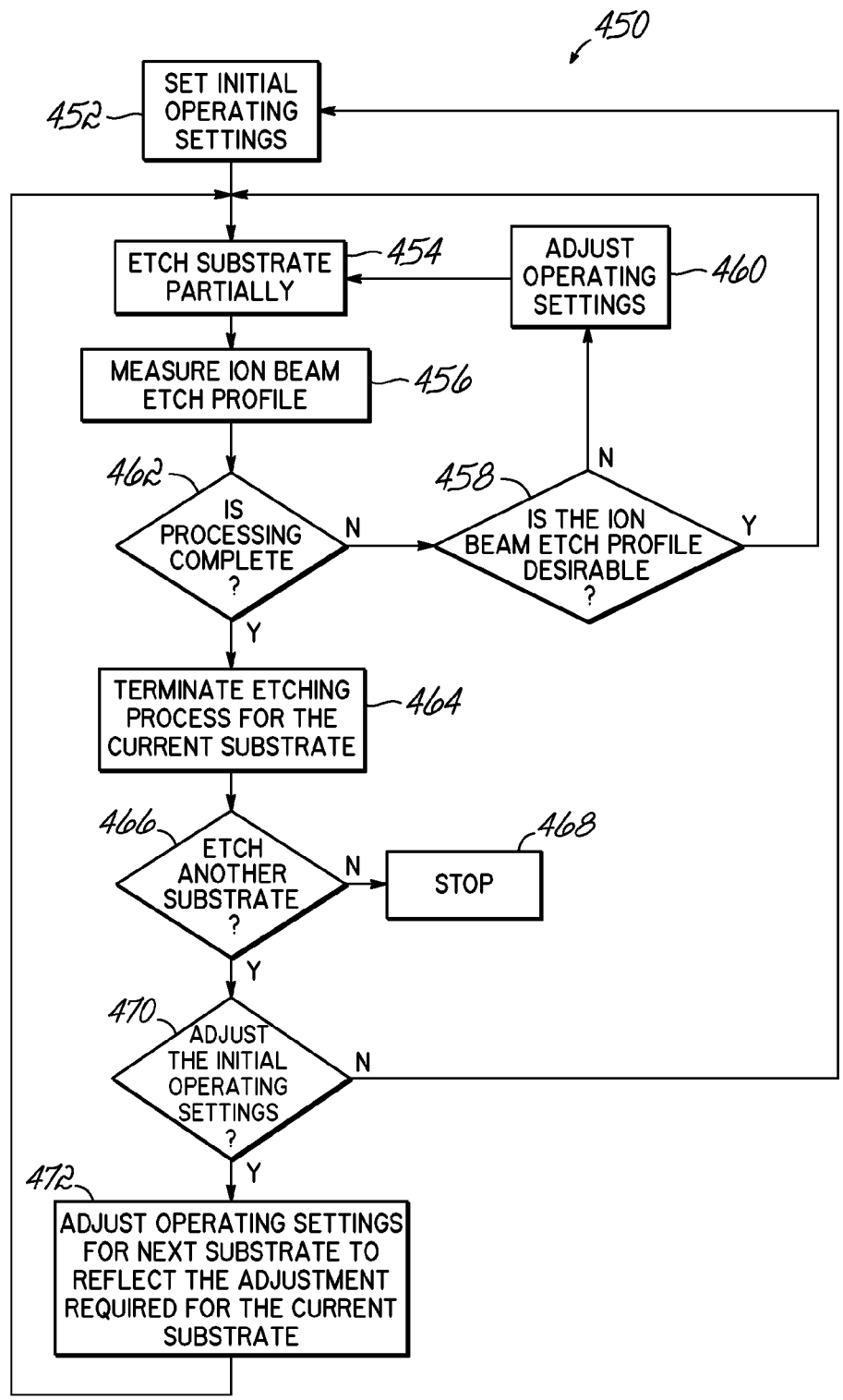
FIG. 12 is a flowchart of a process for re-optimizing the electromagnet current for an ion source in which the ion beam etch rate profile is not within desired limits in accordance with an embodiment of the present invention.

In one embodiment of the present invention, the electromagnet current, $I_{mag}$, may be optimized by adjusting in discrete stages to produce the desired etch profile (i.e. substantially flat profile when a uniform etch process is desired). FIG. 12 is a flow chart illustrating a routine 450 for optimizing the electromagnet current, $I_{mag}$, in this manner and measuring an effect associated with the incremental adjustments. In block 452, operating parameters for the ion source 10 (FIG. 1) are set. Operating parameters may include an initial value of the electromagnet current, $I_{mag}$, which may be derived from a knowledge base generated, such as was described in Example 4. In block 454, the ion source 10 (FIG. 1) is used to partially etch a substrate 11 (FIG. 1). In block 456, the ion beam etch profile is measured.

In block 462, the ion beam etch profile is analyzed to determine whether the etching process is complete based upon the measurement acquired in block 456. Preferably, this is determined by measurement of the actual etch depth at the same time as the etch profile, but it may also be determined based on the average etch rate and the cumulative etch time. If it is determined that the etching process has not concluded, the substrate 11 (FIG. 1) is partially etched again in block 454, and the above sequence is repeated. When the etching process is completed, control is transferred from block 462 to block 464 to terminate the adjustment of the electromagnet current, $I_{mag}$, in discrete steps and, potentially, to etch another substrate with the same technique.

If the etching process is not complete, then the ion beam etch profile is analyzed in block 458 to determine whether it is desirable (i.e., if the ion beam etch profile is approximately flat when a uniform etch process is desired). If the ion beam etch profile is undesirable, the operating settings are adjusted in block 460. Adjustment of the operating settings may include incrementally increasing or decreasing the electromagnet current, $I_{mag}$. If the ion beam etch profile is desirable, no change is made in the operating settings and etching continues with the current operating parameters, which may be the original operating parameters or adjusted operating parameters.

In block 466, a decision is made whether to process another substrate. If not, then control is transferred to block 468 and the routine 450 stops. If an adjustment or correction to the operating settings was required for the substrate, then a query is generated in block 470 to determine if an adjustment should be made to the operating settings for the next substrate to be subjected to the routine 450. If not, then control is returned to block 452 and the operating settings for the next substrate revert to the initial operating settings. Alternatively, if adjustments are desired, control is transferred to block 472 and new initial operating settings are generated to improve the shape of the ion beam etch profile based upon the result of a correction of the current substrate. Control is returned to the entry point to block 454 and the iterative current adjustment and partial etch process is repeated for the new substrate.

Example 6

In one embodiment, the ion source 10 (FIG. 1) may be designed such that at the chosen operating parameters (other than the electromagnet settings) the ion beam etch profile only becomes more convex or more concave as the electromagnet current is increased from zero, within the "usable" range of magnet current. The "usable" range of magnet current refers to the adjustable range of the power supply and magnet design, but may also be limited by the etch performance requirements such as effects of the magnetic field on the beam divergence and/or beam neutralization, as described in respect to Tables 1 and 2.

In order to more fully be able to utilize the electromagnet to fine tune etch profile in such a case, which, in general, may require compensation of either a concave or convex beam profile, the radial transparency of the grid assembly 32 (FIG.

1) representing the ion optics may be designed such that, in the absence of the electromagnetic field (i.e., the electromagnet current, $I_{mag}$, supplied to the wire coils 72, 74 is set to zero), at the operating parameters (exclusive of the electromagnet current setting) of interest, the ion beam etch profile is opposite in convexity to the effect of the magnet (more concave, if the effect of the magnetic field is to increase the convexity, and vice versa). The quantitative extent of this change may, in general, be optimized to allow the most desirable profile to be obtained for the estimated widest range of possible operating conditions and magnetic current settings. In the optimum case, the most desirable density profile will, on average, be achieved at some magnet current midway between zero and the maximum allowed setting.

For example, FIG. 11 graphically shows the effect of electromagnet current on the normalized shape profile, $K_N$, such that the ion beam etch profile becomes more convex as the electromagnet current, $I_{mag}$, is increased in a low magnetic field range from about 0.0 A to about 0.3 A.

Figure 13A:
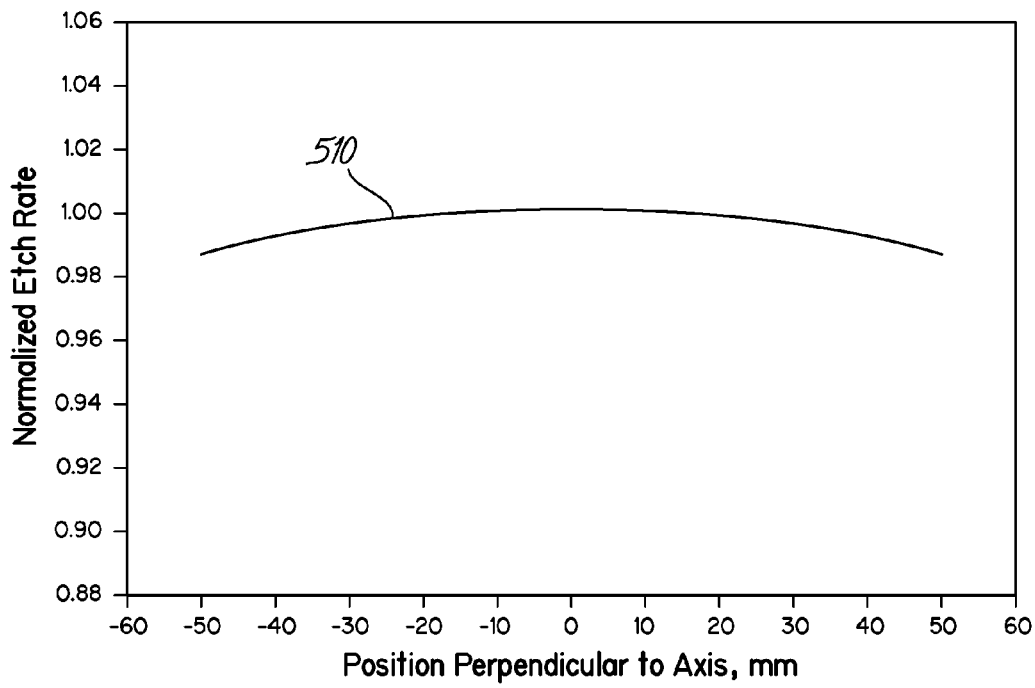
FIG. 13A is a diagrammatic view of normalized etch rate as a function of position relative to the azimuthal axis of the ion source for a substantially flat ion beam etch profile produced by an ion source of an embodiment of the invention at actual operating parameters and with the electromagnet current set to zero.
Figure 13B:
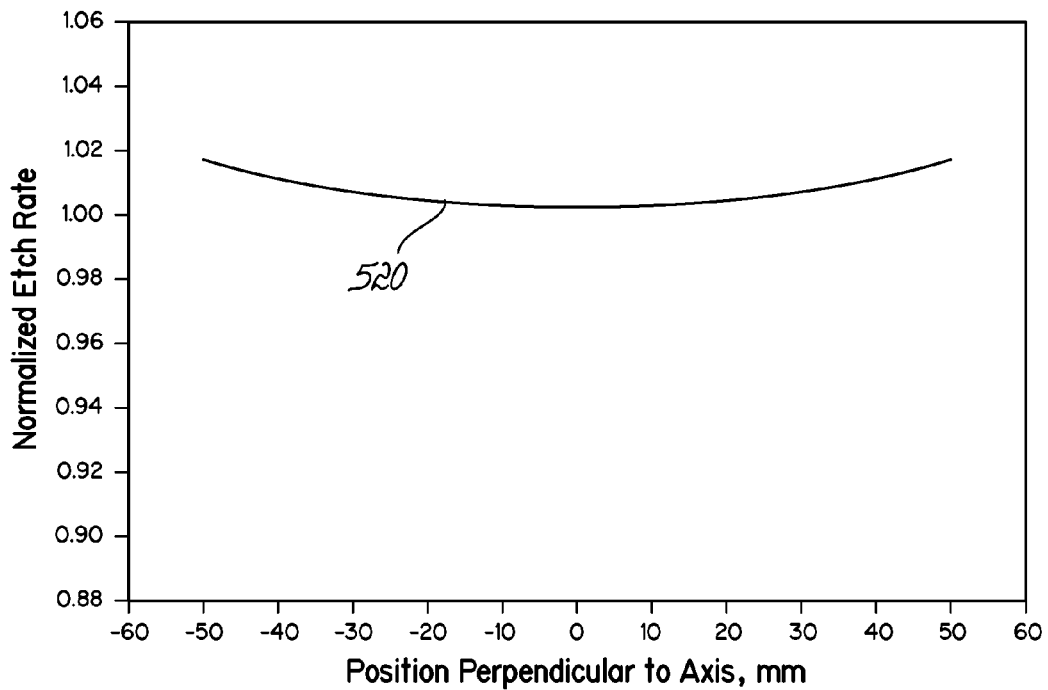
FIG. 13B is a diagrammatic view of a concave flat ion beam etch profile produced by one embodiment of the ion source of FIG. 13A at actual operating parameters with the electromagnet current set to zero when the ion optics grid radial transparency is adjusted.

FIG. 13A illustrates a slightly convex ion beam etch profile 510 for a given set of operating parameters as produced by a previous embodiment of the ion source of FIGS. 1 and 2 and in which the electromagnet current, $I_{mag}$, is set to zero. This profile cannot be made more uniform by the electromagnet operated at low magnetic field strength due to the fact that small increases in the magnet current will only make the profile more concave. FIG. 13B illustrates an ion beam etch profile 520 produced by the same ion source at the same operating parameters with the electromagnet current, $I_{mag}$, set to zero and the radial transparency of the grid assembly 32 (FIG. 1) in the design adjusted to reduce the convexity so that the resultant profile is more concave.

Figure 13C:
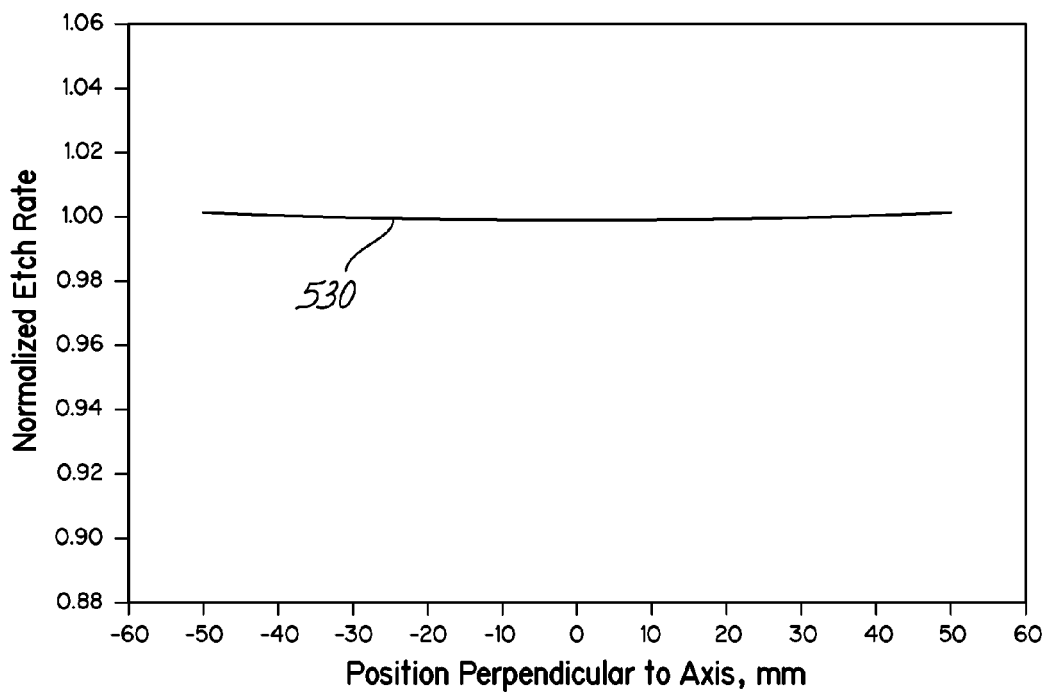
FIG. 13C is a diagrammatic view showing the substantially flat ion beam etch profile produced by one embodiment of the ion source of FIG. 13B at actual operating parameters with the electromagnet current set to a low value.

As illustrated in FIG. 13C, the electromagnet current, $I_{mag}$, to the wire coils 72, 74 may be increased slightly to a relatively low value to reduce the concavity of the ion beam etch profile 520 (FIG. 13B) and results in a more uniform ion beam etch profile 530. In the case of FIG. 11, this method may be beneficially employed to restrict the electromagnet operation to a low magnetic field range, which may be desirable to minimize the magnetic field interference with the ion optics operation (i.e., larger magnetic fields may increase the ion beam divergence because of field plasma distortions in the vicinity of the grid 38 (FIG. 1)) and/or the ion beam neutralization in downstream propagation to the substrate 11 (FIG. 1).

Figure 14A:
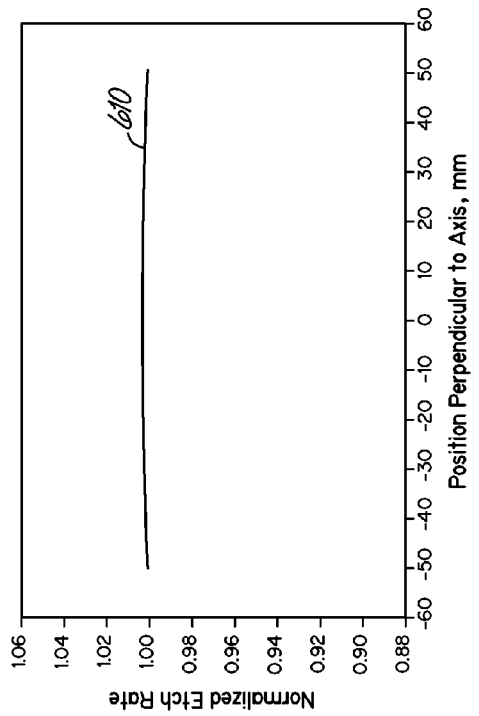
FIG. 14A is a diagrammatic view depicting degradation of the ion beam etch profile, as the ion source ages during use, from an initial condition as shown in FIG. 13B to a condition in which the profile is excessively convex about the azimuthal axis of the ion source.
Figure 14B:
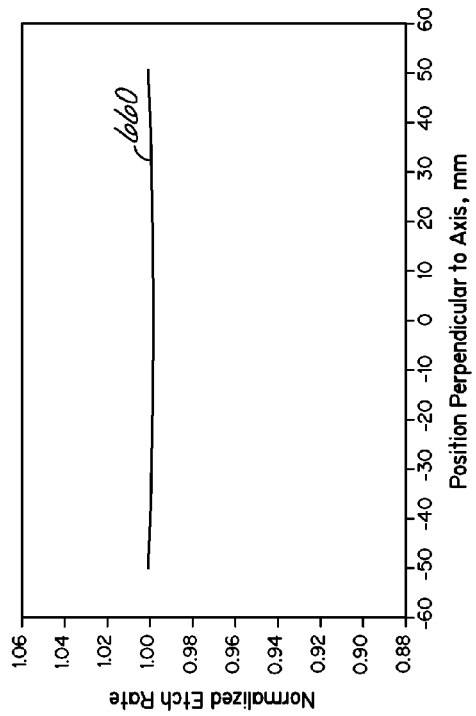
FIG. 14B is a diagrammatic view depicting an adjustment that may be made by decreasing the electromagnet current to restore the ion beam etch profile from the aged condition in FIG. 14A to an operating condition resembling the initial condition.

Adjustments to the electromagnet current, $I_{mag}$, may be similarly utilized to control degradation of the ion beam etch profile as the ion source 10 (FIG. 1) ages. FIG. 14A illustrates degradation of the ion beam etch profile obtained in FIG. 13C (in the case where a uniform etch process is desired) that causes the flat profile 530 (FIG. 13C) to increase in convexity as the ion source 10 (FIG. 1) ages. Specifically, an ion beam etch profile 600 with an increased convexity may be observed as the ion source 10 (FIG. 1) ages with use. FIG. 14B illustrates the effect of the adjustment that may be made by decreasing the electromagnet current, $I_{mag}$, supplied to the electromagnet to flatten the ion beam etch profile.

Figure 14C:
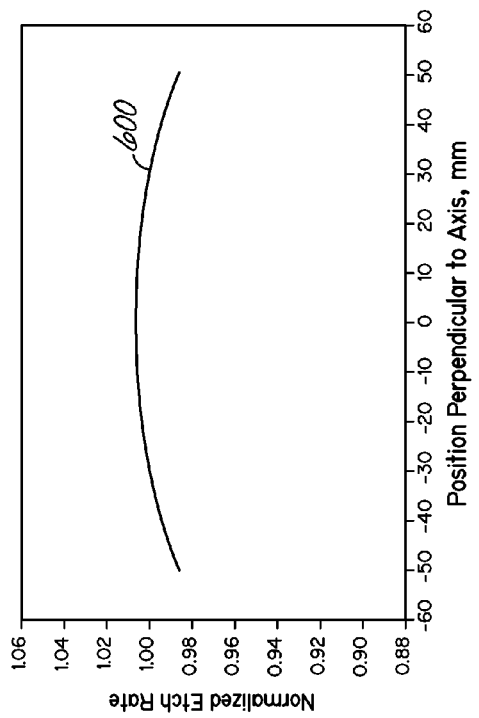
FIG. 14C is a diagrammatic view depicting degradation of the ion beam etch profile, as the ion source ages during use, from an initial condition as shown in FIG. 13B to a condition in which the profile is excessively concave about the azimuthal axis of the ion source.
Figure 14D:
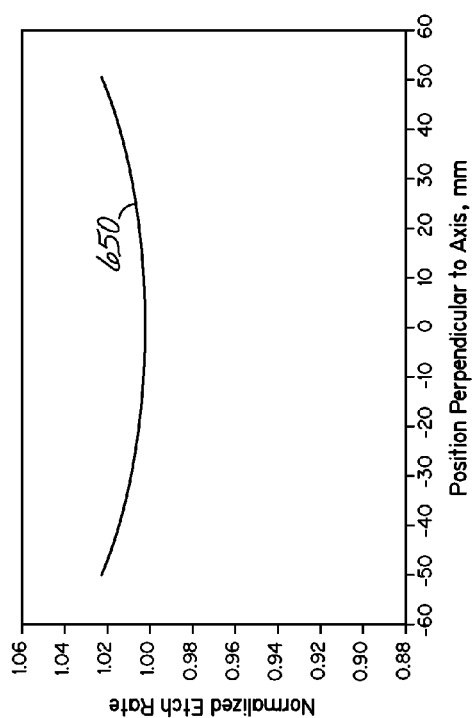
FIG. 14D is a diagrammatic view depicting an adjustment that may be made by decreasing the electromagnet current to restore the ion beam etch profile from the aged condition in FIG. 14C to an operating condition resembling the initial condition to a condition resembling the initial condition.

Vice versa, FIGS. 14C and D illustrate degradation of the flat profile in FIG. 13C that causes the shape profile 530 (FIG. 13C) to increase in concavity with aging of the ion source 10 (FIG. 1) and an adjustment that may be made by increasing the electromagnet current, $I_{mag}$, to flatten the ion beam etch. Specifically, an ion beam etch profile 650 increases in concavity over time as the ion source 10 (FIG. 1) ages with operation. Subsequently, an increase in the electromagnet current, $I_{mag}$, flattens the distribution of the ion flux to produce the ion beam etch profile 660 (FIG. 14D), which has less concavity and more closely resembles profile 530 (FIG. 13C).

If it is desired to optimize the magnetic field 75 (FIG. 1) differently for different substrates to be processed, the magnet current setting to the coils 72, 74 (FIG. 1) may be included as a variable in the process recipe. This value is communicated from the controller 87 (FIG. 1) to the electromagnet power supply 86 (FIG. 1). In order to adjust the magnet current to compensate for variations as described above, recipe control software can be used to automatically rewrite the process recipes.

Any non-uniformity in the ion beam etch profile from azimuthally and asymmetrically perpendicular to the ion source 10 (FIG. 1) about azimuthal axis 19 (FIG. 1) may be negligible or at least smaller than the radial non-uniformity. However, if the non-uniformity in the ion beam etch profile due to azimuthal asymmetry perpendicular to the azimuthal axis 19 (FIG. 1) of ion source 10 (FIG. 1) cannot be disregarded, other adjustments to the position of the electromagnet 42 (FIG. 1) may be made before using the above described methods.

Figure 15:
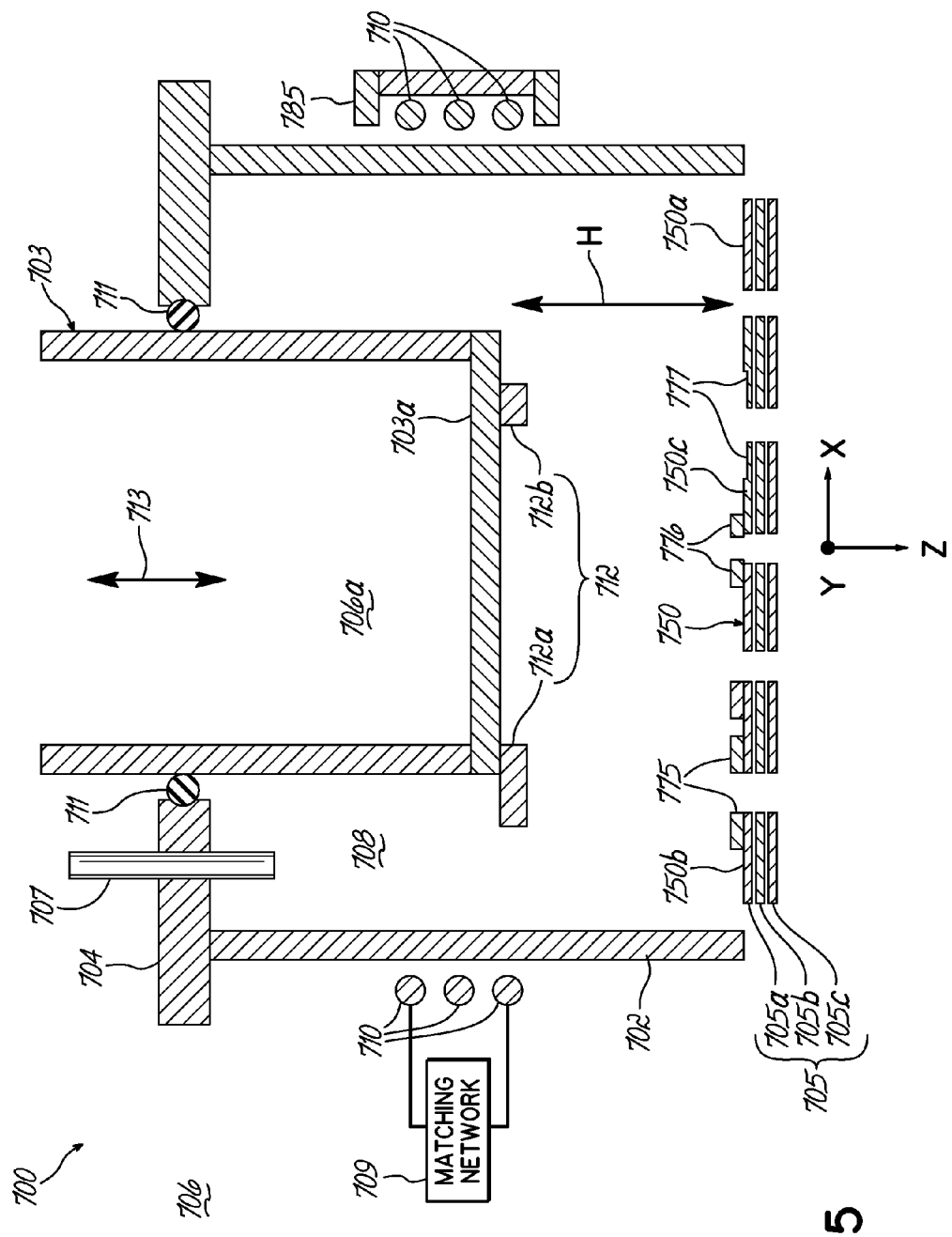
FIG. 15 is a cross-sectional view of a cylindrical chamber in accordance with still another embodiment of the present invention.

Turning now to FIG. 15, an ion source 700 in accordance with still another embodiment of the present invention is shown and includes an RF-ICP discharge chamber 702 with an ion optic assembly 705 mounted to a high vacuum substrate processing chamber (not shown in FIG. 15). As shown, the plasma discharge chamber 702 is defined by an outer dielectric cylinder, an inner cylinder 703 with closed end 703a, herein referred to as the "re-entrant vessel," and the back plate 704. The multi-aperture grid assembly, otherwise referenced as the "ion optics" 705, is situated on the open end of the plasma discharge chamber 702. The ion optics 705, as described previously, extract a beam of ions from the ion source plasma and transport said beam to the process chamber. A low beam divergence ion optic design is used. The source interior is isolated from the external environment 706 by high vacuum seals between these components or is mounted internally inside the process chamber. A controlled flow rate of process gas is introduced to the ion source from gas inlet 707 or through a gas distribution ring. A reduced pressure (typically range from about 0.1 mTorr to about 0.5 mTorr) is maintained in the interior region 708 by means of a high vacuum pump (not shown) situated in the process chamber.

A plasma is generated within the interior region 708 in a conventional manner and by applying RF power (typically on the order of about kilowatt and with a frequency range from about 0.5 MHz to about 15 MHz) from an electrical power supply and matching network 709 to an externally mounted RF coil antenna 710. The RF coil antenna 710 may be disposed about plasma discharge chamber 702, which may comprise, at least in part, a dielectric window. The RF electrical current circulating in the coil antenna 710 generates an axial magnetic field, which is transmitted to the plasma through the dielectric window to ignite the plasma in the manner described previously in detail.

The RF coil antenna 710 may be helical or, preferably, a straight cylindrical design with the axis of each turn being coincident to the axis of the plasma discharge chamber 702 connected by bending straight "legs" in the coil antenna 710. A straight cylindrical coil is preferred to the helical coil shape due to its greater cylindrical symmetry, which can help the symmetry of the plasma in addition to the fact that it is easier to control such a coil in terms of the spacing between the turns and between individual turns and the boundary of the plasma discharge (which affects the RF capacitive and inductive coupling).

In this embodiment, the position of the re-entrant vessel 703 is adjustable, as shown by arrow 713. The height of the plug, H, is defined as the closest distance between the facing surfaces of the re-entrant vessel 713a and the ion optic assembly 705. A seal 711, such as a simple O-ring, is formed between the re-entrant vessel 703 and the back plate 704 to hold the inner cylinder 703 and prevent transport of gases or other materials between the interior region 708 and exterior environment 706. Various shape adjusting extensions 712, two extension 712b, 712b being shown, may be attached to the re-entrant vessel 703. The re-entrant vessel 703 may, itself, be asymmetrically shaped or disposed within the plasma.

The grid 705a in the ion optics assembly 705 that is contacting the plasma, conventionally referred to as a screen grid, is shown as being modified by the local adjustment of the grid thickness, e.g. by the addition of local ion beam extraction tuning features 775, 776 777 or by reduction of the local thickness (by machining away a portion of the grid plate 705a) as shown in feature 777. The tuning feature 775, described herein as an ion acceleration length tuner, is disposed continuously around apertures of interest and effectively and locally increases the thickness of the screen grid 705a. The tuning feature 776, described herein as an aperture size tuner, is disposed continuously around the apertures of interest and essentially and locally decreases the aperture size and increases the thickness of the screen grid 705a. Feature 777, described herein as an ion acceleration length tuner, is disposed continuously around the apertures of interest and effectively and locally decreases the thickness of the screen grid 705a. The thickness of the tuning features 775, 776 may be adjusted to provide the desired effect. These tuning features 775, 766 may alternatively be machined into the screen grid 705a or added to a pre-machined grid 705a. If the grid 705a is not pre-machined with the tuning features 775, 776, 777 the grid 705a may be machined afterward to produce the feature 177. The tuning features 175, 176 may be added, after the fact, by spot welding tantalum foil to a molybdenum grid plate, which is very useful for prototype development of a grid design according to this method.

The ion optics assembly 705 is preferably designed for very low beam divergence while still allowing sufficient beam current to be extracted by adjusting the grid hole sizes and spacing. The size of the holes patterned in the grids 705a may be selected to be sufficiently large such that the substrate process uniformity is not adversely affected by the so called "edge effects" of the hole pattern. Otherwise, the size of the hole pattern is minimized to reduce the power required to drive the ion source 700 at a certain desired beam current density, and also to maximize the mechanical stability of the grid 705a. The optimal size may be determined theoretically or empirically. A simple theoretical method for estimating the size would first determine the border of the substrate processing region of interest and then project this border back to the grid 705a, based on the most divergent significant ion trajectories. To estimate the impact of a particular border region on a given point on the substrate path, the number of holes used to create the disturbance may be compared to the total number of holes within the "cone of influence" contributing to the ion beam treatment process at that same point on the substrate. If the substrate (not shown in FIG. 15) is rotated (except for circular substrate), or otherwise moved during the ion beam process, this border will be larger than for a static substrate, but the impact will be reduced due to the averaging effects of the motion. Also, the further the substrate is located from the ion optics assembly 705, the larger the required diameter of the grid pattern will be. A fully quantitative calculation would require a mathematical model of the entire array of beamlets; however, a very reasonable estimate may be obtained by assuming a maximum straight line beam divergence angle for all of the beamlets, which may be derived from experimental measurement, or modeling of a single beamlet based on the ion optic design, or from calculations for the same ion optic design published in the literature.

To control the spacing of the grid 705a, a high voltage dielectric material, such as alumina, is disposed between the plates at the periphery of the assembly. Preferably, to further improve the mechanical stability of large area ion beams, additional dielectric spacers are used in the beam extraction area. However, use of such spacers creates islands of missing grid holes, which locally disturbs the local uniformity and angular distribution of the extracted ion beam and may impact the substrate treatment process. While such disturbances may be practically insignificant in conventional devices, the effects may be significant for the high beam collimation conditions and extremely stringent uniformity specifications of the present invention. Furthermore, such disturbances may be more significant for a static substrate treatment process, wherein rotation of the substrate cannot be used to average out exposure of the substrate to local effects of the ion beam. Thus, and in accordance with the instant embodiment of the present invention, the spacers 712a, 712b may be positioned within a region between the edge of the beam pattern and a restricted area within which such spacers 712a, 712b may significantly impact the beam profile. The restricted zone is determined from theoretical calculation or empirical data in a manner that is analogous to the calculation of the minimum grid pattern diameter; however, the impact in any one local region includes individual islands rather than a complete border of missing holes. Therefore, a few spacers 712a, 712b may be tolerated, even if positioned relatively close to the substrate center and so long as the spacers 712a, 712b do not require large islands of missing holes. For optimum mechanical stability of the grid 705a, it is preferable that the spacer locations have some degree of symmetry, although the impact on a rotating substrate can be greater in that case. It is also clear for this design that any other type of disturbance due to the grid pattern, other than those as described herein to improve the substrate process, must be kept outside of this restricted zone. This is a reason that the "micromasking" or "acceleration-length-tuning" methods were developed, that is, for controlling the local beamlet currents instead of blocking out individual apertures or arrays of apertures, as is done by conventional grid patterning and masking techniques.

For a low divergence grid 605a, six spacers may be were located on 60° sectors of a 7.5 inch diameter.

In the case of very large grid areas, it may not be preferable to completely restrict spacers 712a, 712b from the impact zone without sacrificing the grid mechanical stability. An alternate design may provide one single spacer 812 (FIG. 16) in the center of the beam. The impact of this center spacer 812 (FIG. 16) on the substrate treatment in the case of rotating substrates may be minimized by introducing an offset between the axis of the grid spacer and the axis of rotation of the substrate.

One further aspect of the embodiment is the addition of an array of localized RF magnetic flux concentrators 785 in some portion of the RF coil antenna 710, which is shown in accordance with one embodiment in FIG. 15.

Figure 16:
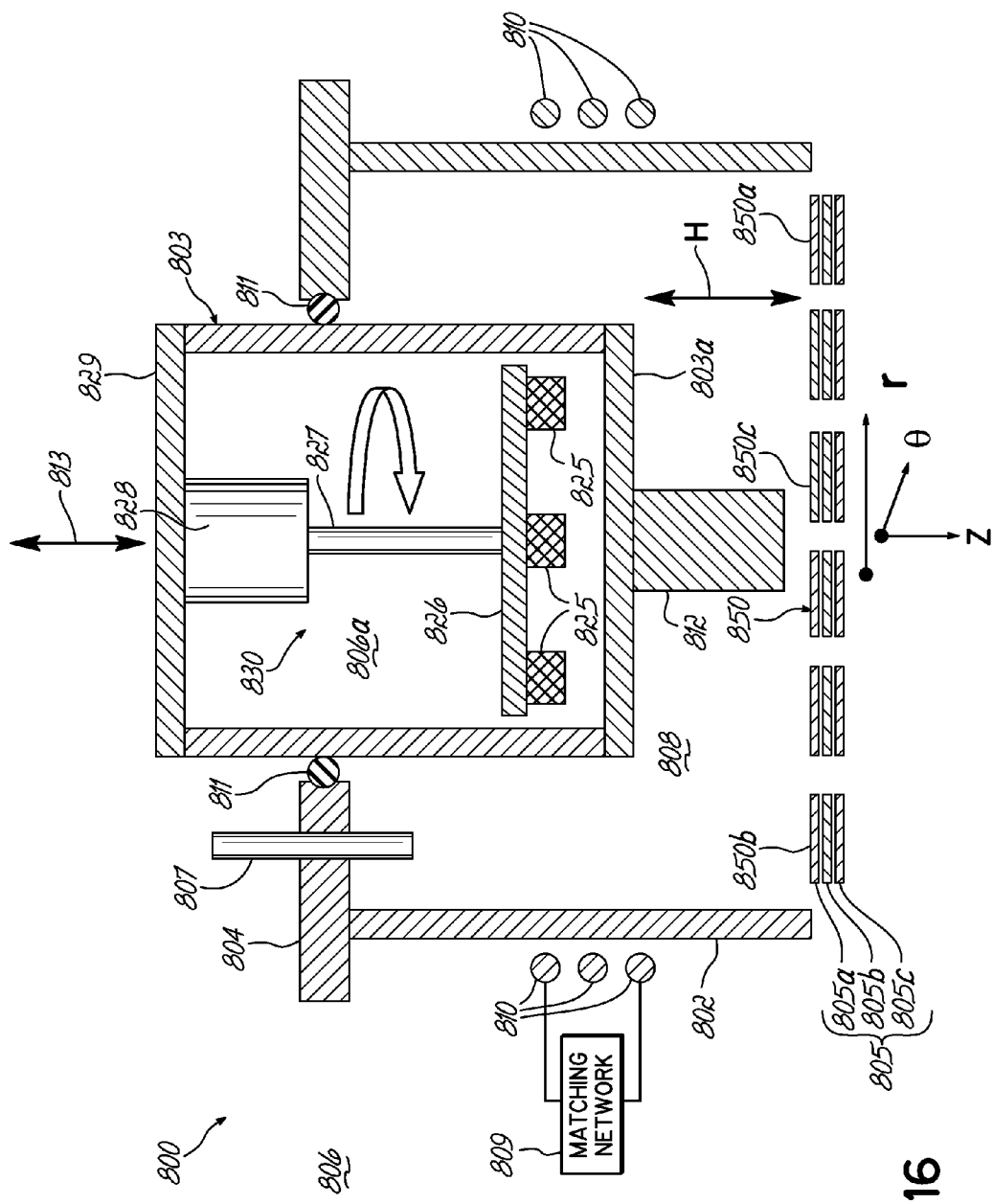
FIG. 16 is a cross-sectional view of a cylindrical chamber in accordance with another embodiment of the present invention.

An ion source 800 is accordance with another embodiment of the present invention is shown in FIG. 16. In that embodiment, the height of a magnet array 825 may be adjusted independently of the height of the re-entrant vessel 703 e.g. by adjusting the length of a shaft 827 having a smaller cylindrical extension 812 thereon.

Returning to FIG. 1, and to achieve high plasma and ion flux uniformity, the overall shape of the plasma discharge chamber 702 has been optimized. The position of a shaped re-entrant inner vessel 703, the shape of the extensions 712a, 712b, the RF flux concentrator 785, and the beamlet extraction tuning features 175, 176 allow further adjustment of the uniformity of plasma density and the ion flux that reaches the array of ion optical elements that make up the grid assembly 705 by interfering with the ion diffusion process.

Without such features, a co-axial coil ion source design is generally characterized as a rapid decrease in the RF electric field from the RF coil antenna 710 with penetration distance into the conductive plasma (the skin effect). The rapid decrease results in the electron temperature, $T_e$, and the ionization rate of the plasma being higher at the periphery of the plasma volume near the RF coil antenna 710. However, ionization processes may occur at distances spaced away from the RF coil antenna 710, due to the collisionless nature of the plasma at typical pressures. Furthermore, generated ions, if unimpeded, will diffuse in different directions and recombine at the walls. Calculation of the plasma and $T_e$ distributions is difficult due to an inability to accurately model a low-pressure, collisionless plasma. The usual first order effect is a decrease in plasma density, n, with increasing radius, r, from a center of the antenna 710. Thus, the plasma density at the plasma sheath formed at the surface of the ion optic assembly 705 is greater at a center region 750c, than at peripheral regions 750a, 750b.

The ion flux reaching the surface ion optic assembly 705 is directly proportional to n and $T_e^{1/2}$ and may be more uniform given the average $T_e$ is expected to be higher on the periphery. The increased $T_e$ can at least partially compensate for lower plasma density in determining the uniformity of the ion flux. This factor can result in the peak of the ion flux profile being located in a position other than the center of the plasma discharge chamber 702, even if the discharge chamber design is itself symmetrical (depending on the gas species, discharge chamber geometry, pressure, etc.). In other words, and on average, the flux uniformity may not change monotonically with source radius.

Another consideration is that, again due to the $T_e$ dependence on global uniformity, φ, optimization of both n and φ may not be possible and ideal means of plasma adjustment should optimize both or at least allow independent optimization. Another important consideration is that even if the plasma discharge chamber 702 is perfectly symmetric, relatively recent work has shown that several factors, including RF transmission line effects and ponderomotive forces may induce plasma asymmetry. The result is that there will be several "spots" of high or low n and $T_e$ superimposed over a more "global" pattern of radial variation in the plasma density. These variations result in greater variation in the beam than is desired.

It has been found that to improve uniformity the beam divergence angle uniformity and parallelism must be improved. According to various embodiments of the present invention, a design that minimizes these non-uniformities may comprise:

(1) A number and shape of RF magnetic flux concentrator pieces 785 determined by measuring the uniformity of the RF magnetic field of the bare RF coil antenna 710 and including additional flux concentrator pieces to raise this magnetic field where required. One option is a complete 360° flux concentrator that would minimize any variations in the RF coil antenna 710 from affecting the uniformity of the induced magnetic field in the plasma.

(2) Optimum ion beam parameters may be selected based on the ion optic assembly design, although the optimization procedure depends on the particular objective. According to embodiments of the present invention, a process pressure of about $2 \times 10^{-4}$ Torr may be selected. A range of ion beam voltages is then selected to achieve the desired substrate etch rates. The beam current and other grid potentials may also be optimized to provide desired conditions of minimum beam divergence. The plasma uniformity is characterized at the selected pressure and RF power conditions.

(3) The variation in plasma density, n, and electron temperature, $T_e$, at the grid plane are measured at the beginning and after major adjustments using miniature Langmuir probes inserted within apertures of the grid 705a such that a saturation ion current (ion flux) reaching the grid 705a is measured. The ion source design may be more finely optimized based on actual beam current uniformity and beam dispersion (divergence, divergence uniformity, parallelism) measurements. A beam uniformity fixture having a large array of measurement points across the beam diameter may be used to provide higher accuracy and resolution of the beam profile, which is necessary to meet these objectives. Actual beam treatment (etch) data may also be periodically measured during the source development process and fed back into the ion source design. This is a very effective and almost necessary means of optimizing to attain the extreme levels process uniformity required, and is particularly important for determining the uniformity of a static, tilted etch process.

(4) Based on data obtained on a prototype discharge chamber, the diameter, $D_p$, of the plasma discharge chamber 702 with respect to the size of the grid pattern, $D_g$, is optimized. For example, a ratio of $D_p$ to $D_g$ range from about 1.3 to about 1.8 has been found to be a reasonable when $T_e$ and n are quite uniform. Such ratios are not conventionally used due to the otherwise high geometrical inefficiency (excess size and cost considerations).

(5) The initial re-entrant vessel 703 is nominally designed as a cylinder and mounted with its axis co-incident with the axis of the plasma discharge chamber 702. The diameter of the cylinder comprising the re-entrant vessel 703 may be based on several factors, including the diameter of the substrate to be processed by the ion beam, the diameter of the grid pattern, the RF skin depth, accommodation of certain embodiments of the present invention, etc. The height range is designed such that re-entrant vessel 703 may come within a close distance of the ion optics assembly 705 (a minimum height, H) and be as large as the length of the plasma discharge chamber 702 (a maximum height, L). In general, the plasma density and/or ion flux at the center may be suppressed by decreasing the height toward H, or enhanced by increasing the height toward L. It has been found that this is more effective for changing the beam profile at large radii, such as radii of about 4 inches. For smaller radii, there is still some effect, but other adjustment factors may be more effective.

(6) One or more extensions 712, 812 to the re-entrant vessel 703 may be used to fine-tune the radial variation in plasma and ion flux distribution by flattening out asymmetric peaks in the plasma distribution. The location and size of the extensions 712, 812 may be determined by the size of the asymmetry to be adjusted. The height of the extension 712, 812 may be optimized in accordance with principles that are similar to those of the height of the re-entrant vessel 703, as provided in Section (5) above. However, it has been found that at a certain close range of distances from the grid 705a, the effect of such extensions 712, 812 may become complicated, wherein a decrease in the beam current density beneath the extension 712, 812 creates large dips around the edges of the feature. Operation in this range is not useful.

(7) Residual peaks in the plasma density profile may be reduced by incorporating one or more ion acceleration tuning features 775, 776. These tuning features 775, 776 are confined to one or more apertures of the ion optics assembly 705 in the relevant region of interest and serve to adjust (for example, reduce) the ion beam current extracted from the plasma at a local site on the ion optics assembly 705 and compensate for residual variations in the plasma density. The tuning features 775, 776 operate by taking advantage of the fact the ion beam current is inversely proportional to the gap, g, between screen grid 705a and the accelerator grid 705b, and thus, inversely proportional to the thickness, t, of the screen grid 705a. A more exact relationship is that the maximum, extractable current is inversely proportional to the square of the effective ion acceleration length, d, which is commonly defined as the distance from the center of the plasma meniscus at the screen grid 705a to the facing surface of the accelerator grid 705b. The required adjustments are based on previously developed empirical correlation charts and, if necessary, further tuned. The tuning feature 776, in which the hole size and thickness ire adjusted, is used where the required effect is relatively large. The adjustment is calculated based on the beamlet current density being directly proportional to the area of the hole. The tuning feature 775 is then used for fine tuning. In using these adjustments care is taken (if required by the particular objective) not to disturb the beam divergence at the expense of improving the flux uniformity, or vice versa.

(8) Process parameters, including pressure and gas flow rate, may also be optimized.

For some of these factors, in particular optimizing the size of the plasma discharge chamber 702, both of the plasma density, n, and the global ion flux φ may be optimized simultaneously. Other factors influence n or φ to relatively different degrees. The combination of several adjustment techniques, as described, allows better overall optimization.

As an alternative to the requirements for a perfectly uniform plasma distribution, a particular non-uniform plasma or ion flux profile may be attained, for example, to compensate a systematic variation in the beam profile due to a systematic non-uniformity of a particular ion optics assembly 705 or to improve one feature (such as the ion beam process uniformity) in particular. In yet another alternative embodiment, the starting ion optics assembly 705 may be made deliberately non-uniform to improve the global uniformity of the beam current density prior to adjusting the coil antenna 710. This may be a preferred approach for certain features that are relatively hard to adjust in the plasma, including, for example, flattening the plasma density profile within the center region of the discharge chamber 702. Also, the grid design may improve efficacy of the incorporated plasma adjustment features. For example, most of the adjustment techniques described above operate by suppressing, rather than, enhance, the extracted beam current from a certain region. If the stable plasma profile has a large dip in the beam current density (ion flux) map, a potentially best method of improving the profile may be to open the grid pattern in that area only, leaving the local "high" spots to be treated by one of the aforementioned adjustment methods. Other aspects of the grid design are based on the requirements for beam divergence and reduced sensitivity to variations in the mechanical structure, as are known in the art.

Materials of construction of the dielectric window of the plasma discharge chamber 702 may include materials such as quartz or alumina. The re-entrant vessel 703, the backplate 704, and the extensions 712 may also be dielectric to minimize RF coupling from the coil antenna 710. Depending on the design, the re-entrant vessel 703, the backplate 704, and the extensions 712 may be fabricated from a nonmagnetic conductor material that is compatible with the gas plasmas employed in the plasma discharge chamber 702, including, for example, aluminum, anodized aluminum, or copper. If a conductor is used for the backplate 104, then proper care should be taken to isolate the exterior from human exposure to the high potentials generated by the ion source 700. Grids 705a used in the ion optics assembly 705 are preferably constructed from molybdenum, carbon, or other materials having good mechanical properties, electrical conductivity, and thermal conductivity at operating temperatures range from about 100° C. to about 500° C. and that are resistant to warpage under thermal cycling between operating and room temperature. The sliding seal 711 may include any vacuum compatible compliant material, such as VITON. The RF magnetic flux concentrator 785 may be constructed from a high frequency magnetodielectric material, such as ferrite, or suitable materials known under the commercial name FLUXTROL.

Referring again FIG. 16, an ion source 800 having an internal magnet assembly 830 mounted inside the re-entrant vessel 803 is shown and includes an array of magnets 825 attached to a plate 826. The plate 826 is, in turn, attached to motor 828 via a rod 827, the motor 828 being mounted on a lid 829. With this assembly, the magnet array 825 may be rotated during the ion beam process.

It has been found with this construction that both fixed magnet and moving magnet arrays 825 can be beneficially used to improve the ion beam processing uniformity. In general, the influence of moving magnet arrays 825 is predicted from the fact that magnetic fields disturbs plasma diffusion by reducing the conductivity of electrons in directions that are generally perpendicular to the field lines and increasing the electron densities along the field lines. The location of the magnets 825 inside the adjustable height re-entrant vessel 803 allows optimum positioning of these magnetic field lines with respect to the RF coil antenna 810 and the ion optics assembly 805.

Figure 17:
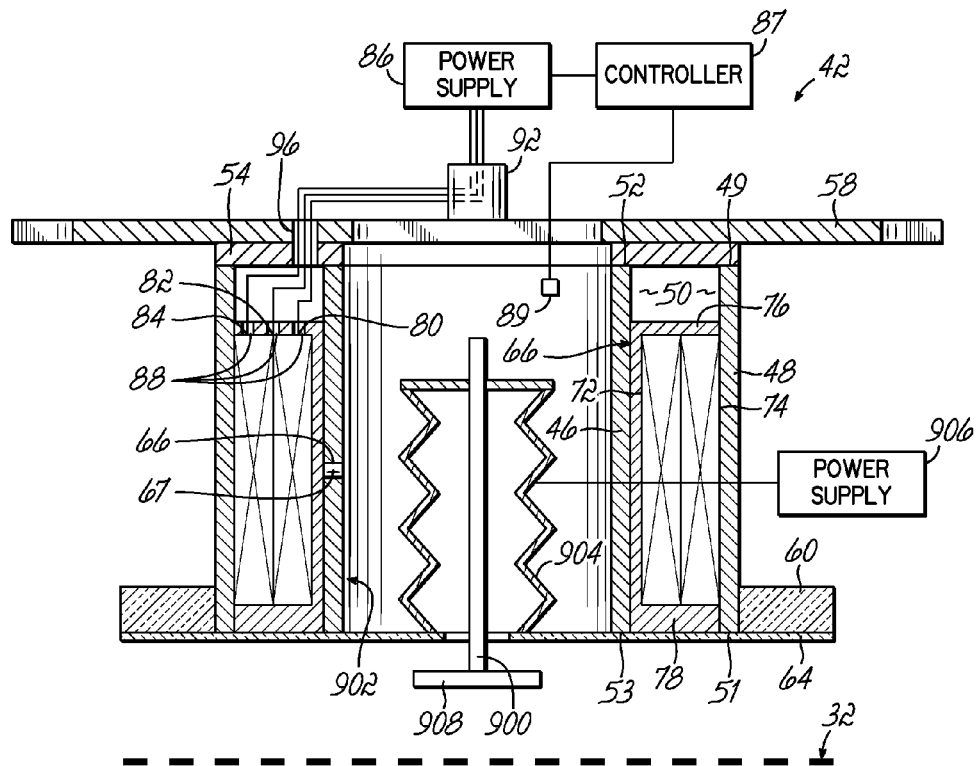
FIG. 17 is a cross-sectional view of an electromagnet including a plasma shaper in accordance with still another embodiment of the present invention.

Turning now to FIG. 17, an electromagnet 42 for use in a vacuum processing system 12 (FIG. 1) is shown in accordance with another embodiment of the present invention and wherein similar reference numbers refer to similar features of FIG. 2. However, as shown, the electromagnet 42 of FIG. 17 further includes an adjustable plasma shaper 900 extending from a central portion 902 of the electromagnet 42 and into the plasma discharge space 24 (FIG. 1). The plasma shaper 900, as described herein, further extends the tunable range of the ion flux distribution. More particularly, the plasma shaper 900 may be operably coupled to a bellows 904 that, when powered via the power supply 906, is operable to advance and/or retract the plasma shaper 900 with respect to the plasma discharge space 24 (FIG. 1).

The plasma shaper 900 may be comprised of a generally nonmagnetic conductor material, similar to the extensions 712, 812 (FIGS. 15 and 16) described previously. According to the illustrative embodiment of FIG. 17, the plasma shaper 900 may be generally t-shaped, having a rectangularly-shaped head 908 that is positioned symmetrically with respect to a longitudinal axis of the plasma shaper 900, and that is positionable with respect to the plate 64. Still more particularly as to the illustrated embodiment, the head 908 of the plasma shaper 900 may have a diameter of about 1 inch. The rod extending upwardly from the head 908 and into the central portion 902 may have a width that is minimal as compared to the diameter of the head 908, for example, a diameter of about 0.090 inches.

Figure 19:
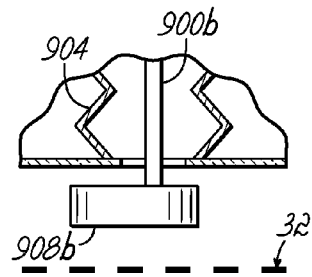
Figure 20:
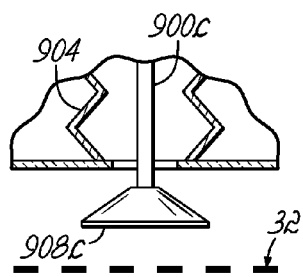
Figure 21:
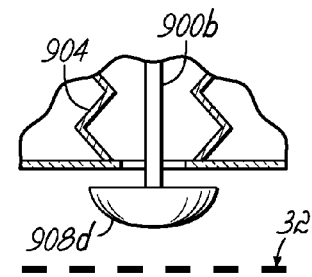

Other head designs may be used and not limited to those expressly illustrated and described herein. For example, the plasma shaper 900a may include a reverse, conically-shaped head 908a (FIG. 18), an off-set rectangularly-shaped head 908b (FIG. 19), a conically-shaped head 908c (FIG. 20), or a semispherical-shaped head 908d (FIG. 21).

The plasma shaper 900 may be useful in compensating for, or creating, a localized bump or localized dip within the ion beam etch profile. For instance, a localized bump occurs within a convex beam profile and includes an area of disportionate increase in the current density as compared to the overall, natural convexity of the ion beam Likewise, a localized dip occurs within a concave beam profile and includes an area of disportionate decrease in the current density as compared to the overall, natural concavity of the ion beam.

In that regard, and with reference now to FIGS. 22A-23B, a method of using the plasma shaper 900 according to one embodiment of the present invention is shown. Generally, the plasma shaper 900, positioned at a certain distance within a selected range of distances from the grid assembly, increases the ion flux along the longitudinal axis of the plasma shaper 900 whereas conventional thought was that the shaper 900 would only suppress ion flux. When the plasma shaper 900, in slidable relation to the electromagnet 42, is moved to a "far field" position, e.g., a greater distance from the grid ion optics, the impact of the plasma shaper 900 is minimized. In fact, in some embodiments, the plasma shaper 900 may be retracted fully within the electromagnet 42, tantamount to removing the plasma shaper 900 from the ion source 10 (FIG. 1).

With specific reference to FIGS. 22A and 22B, the plasma shaper 900 may therefore be used, in conjunction with the electromagnet 42, to generate a wide range of etch profiles. As to a dip or general concavity in the ion beam, the plasma shaper 900 may be advanced from a first position, $P_1$, to a second position, $P_2$, that is closer to the grid assembly as compared to the first position $P_1$. Movement to the second position, $P_2$, generates a localized increase in the ion flux at the region of the dip. Resultantly the dip, or concavity, is reduced and a more uniform profile is shown.

As may be applied generally, and in practice, the grid assembly may be manufactured to initially provide a concave ion beam current density with no magnetic field applied thereto. In this way, the plasma shaper 900 may be advanced, over operational time, from the first position, $P_1$, to the second position, $P_2$, to counteract and compensate for increased concavity, due to aging.

FIGS. 23A and 23B illustrates the plasma shaper 900 as used with convexity and/or bump in the ion beam, the plasma shaper 900 may be retracted from the first position, $P_1$, to a third position, $P_3$, that is further from the grid assembly as compared to the first position, $P_1$. By increasing the distance between the head 908 of the plasma shaper 900 and the grid assembly, the convexity or bump may be compensated.

While not considered to be limiting, the closest useful position, e.g., second position, $P_2$, of the plasma shaper 900 relative to the grid assembly may be determined by a width of the plasma sheath, proximate the grid assemblies. Generally, the second position may be considered to range from about 1 mm to about 1 cm from the grid assemblies; however, the range is largely dependent on plasma conditions, such as plasma density and electron temperature and thus should not be limited to any particular range described herein.

Figure 18:
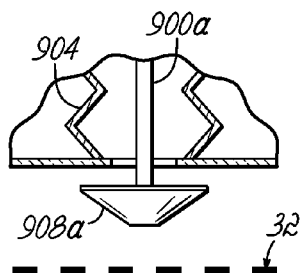
FIGS. 18-21 are side-elevational views of plasma shaper heads according to various embodiments of the present invention.

In other embodiments, such as the plasma shaper 900b of FIG. 18, radially-offsetting the head 908b allows for fine tuning of magnetic field effects that may be stronger within one area as compared to another, more axially-aligned area. Because the substrate is generally rotated, asymmetries created by this offset may be averaged out. Otherwise, the offset may reduce any systematic process or aging induced symmetries, as was described in detail above. Alternatively, and in those embodiments in which the substrate is not rotated, the plasma shaper 900b may be rotated so as to average out the asymmetry.

Although not expressly described herein, the adjustable plasma shaper 900 may be used in any ion source embodiment described herein or within the scope of the present invention. Accordingly, the plasma shaper 900 may, in some embodiments, be incorporated into an ion source having the multi-stage positioner 100 shown and described with reference to FIG. 4. In this way, greater control and further tunable range may be achieved by adjusting the position of one or both of the electromagnet 42 and the plasma shaper 900.

While the present invention has been illustrated by a description of the various embodiments and examples, and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the scope of the inventive concept.

What is claimed is:

1. An ion source for a plasma processing apparatus, comprising:
   a plasma discharge chamber configured to contain an ignited plasma therein;
   an optical grid positioned proximate a first end of the plasma discharge chamber, the optical grid having a plurality of apertures configured such that ions from the plasma within the plasma discharge chamber pass through the apertures of the plurality and bombard a substrate;
   a re-entrant vessel positioned proximate to a second end of the plasma discharge chamber, the second end generally opposing the first end, the re-entrant chamber configured to shape the plasma within the plasma discharge chamber; and
   a plasma shaper extending from the re-entrant vessel and into the plasma discharge chamber,
   wherein a position of the plasma shaper relative to the optical grid is adjustable between a first position and a second position that is closer to the optical grid than the first position, the position of the plasma shaper being operable to change a plasma density distribution within the plasma discharge chamber.

2. The ion source of claim 1, further comprising:
   a radio frequency source for igniting and sustaining the plasma within the Plasma discharge chamber.

3. The ion source of claim 1, further comprising:
   one or more magnets positioned within the re-entrant vessel.

4. The ion source of claim 1, further comprising:
   An actuator configured to move the plasma shaper between the first and second positions.

5. The ion source of claim 4, wherein the actuator comprises a bellows.

6. The ion source of claim 1, wherein the plasma shaper includes a shaped head within the plasma discharge chamber.

7. The ion source of claim 6, wherein a shape of the shaped head is rectangular, conical, reverse conical, or semispherical.

8. The ion source of claim 6, wherein the shaped head is off-set with respect to a longitudinal axis of the plasma shaper.

9. The ion source of claim 1, wherein the plasma shaper is operably coupled to the re-entrant vessel such that movement of the plasma shaper between the first and second position comprises moving the re-entrant vessel between respective first and second positions, the second position being closer to the optical grid than the first position.

10. The ion source of claim 1, wherein the plasma shaper is moveable between the first and second position and with respect to the re-entrant vessel.

11. The ion source of claim 10, wherein the first position of the plasma shaper is within the re-entrant vessel.

12. A plasma processing apparatus, comprising:
an evacuated chamber having opposing ends;
the ion source of claim 1 positioned within the evacuated chamber at one of the opposing ends; and
a substrate holder positioned within the evacuated chamber at the other opposing end and configured to support a substrate thereon.

13. A method of operating a radiofrequency ion source that includes a discharge chamber having a discharge space therein, the method comprising:
generating a plasma with a plasma density distribution from a working gas in the discharge space of the discharge chamber;
extracting an ion beam from the plasma with at least one electrode disposed at a first end of the discharge space; and
adjusting the plasma density distribution by moving a plasma shaper with respect to the at least one electrode.

14. The method of claim 13, further comprising:
determining an actual distribution profile of a density of the ion beam proximate to a wafer processing location;
comparing the actual distribution profile of the ion beam density with a desired distribution profile for the ion beam density; and
based upon the comparison, moving the plasma shaper a selected distance.

15. The method of claim 13, wherein the plasma shaper is moved between a first position and a second position that is closer to the at least one electrode than the first position.

* * * * *